US012670963B2

(12) United States Patent

Guo et al.

(10) Patent No.: US 12,670,963 B2

(45) Date of Patent: Jun. 30, 2026

(54) SINGLE-LEVEL MEMORY CELL ERROR ON-CHIP DETECTION

(71) Applicant: Sandisk Technologies, Inc., Milpitas, CA (US)

(72) Inventors: Jiacen Guo, Cupertino, CA (US); Wei Cao, Fremont, CA (US); Xiang Yang, Santa Clara, CA (US)

(73) Assignee: Sandisk Technologies, Inc, Milpitas, CA (US)

( * ) Notice: Subject to any disclaimer, the term of this patent is extended or adjusted under 35 U.S.C. 154(b) by 76 days.

(21) Appl. No.: 18/442,693

(22) Filed: Feb. 15, 2024

(65) Prior Publication Data

US 2025/0266110 A1 Aug. 21, 2025

(51) Int. Cl.
| | |
|---|---|
| *G11C 16/00* | (2006.01) |
| *G11C 16/26* | (2006.01) |
| *G11C 16/34* | (2006.01) |
| *G11C 29/52* | (2006.01) |

(52) U.S. Cl.
CPC .......... *G11C 16/3459* (2013.01); *G11C 16/26* (2013.01); *G11C 29/52* (2013.01)

(58) Field of Classification Search
CPC . G11C 16/3459; G11C 16/26; G11C 11/5642; G11C 29/52
See application file for complete search history.

(56) References Cited

U.S. PATENT DOCUMENTS

| | | | |
|---|---|---|---|
| 10,353,598 B2 | 7/2019 | Huang | |
| 2013/0117634 A1* | 5/2013 | Joo ...................... | G06F 11/1068 |
| | | | 714/E11.034 |
| 2020/0176045 A1* | 6/2020 | Jung ...................... | G11C 29/52 |

* cited by examiner

*Primary Examiner* — Uyen Smet
(74) *Attorney, Agent, or Firm* — Dickinson Wright PLLC

(57) ABSTRACT

A memory apparatus includes memory cells configured to store a threshold voltage corresponding to one of a plurality of data states. The memory apparatus also includes a control means configured to detect whether data stored in a group of the memory cells as one bit per each of the memory cells has errors. The control means is also configured to bypass error correction of the data stored in the group of the memory cells in response to not detecting the errors in the data stored.

20 Claims, 21 Drawing Sheets

| WL# | FIRST | FOGGY | FINE |
|-----|-------|-------|------|
| 0 | 1 | 3 | 6 |
| 1 | 2 | 5 | 9 |
| 2 | 4 | 8 | 12 |
| 3 | 7 | 11 | 15 |
| 4 | 10 | 14 | 18 |
| | ... | ... | ... |
| 82 | 244 | 248 | 252 |
| 83 | 247 | 251 | 255 |
| 84 | 250 | 254 | 257 |
| 85 | 253 | 256 | 258 |

*FIG. 7B*

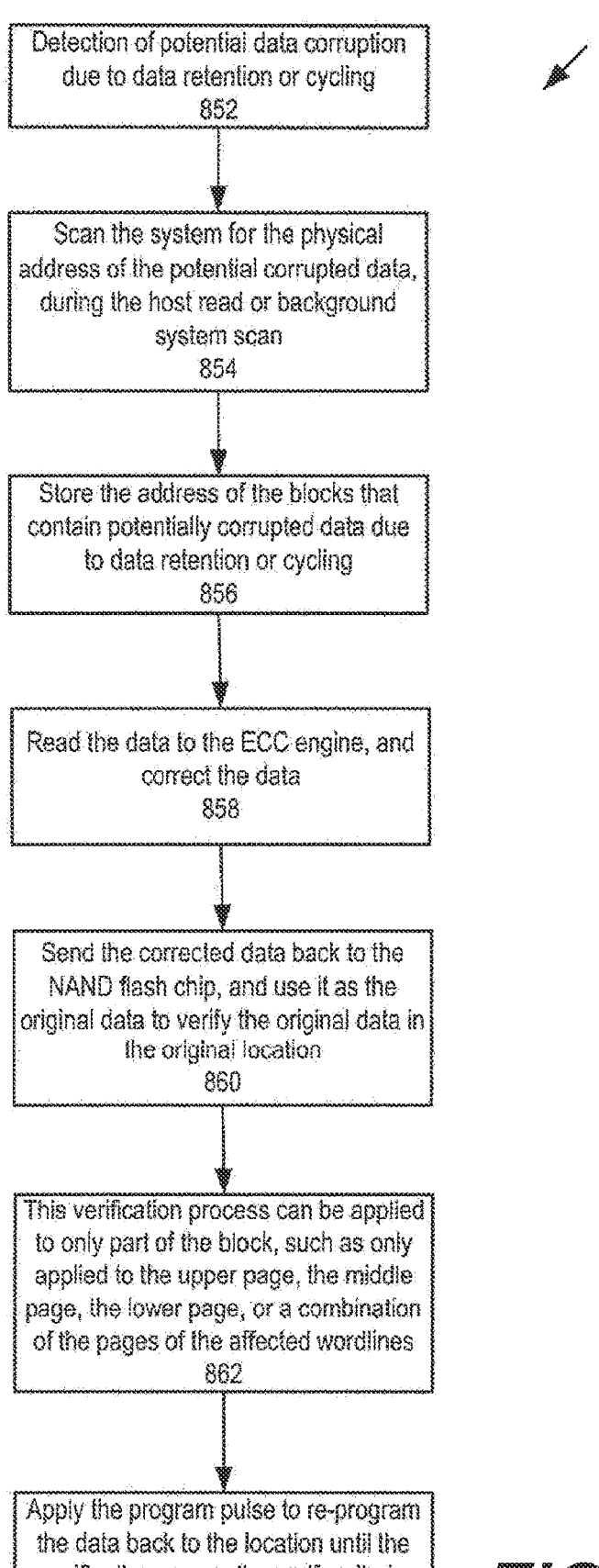

850

Detection of potential data corruption
due to data retention or cycling
852

Scan the system for the physical
address of the potential corrupted data,
during the host read or background
system scan
854

Store the address of the blocks that
contain potentially corrupted data due
to data retention or cycling
856

Read the data to the ECC engine, and
correct the data
858

Send the corrected data back to the
NAND flash chip, and use it as the
original data to verify the original data in
the original location
860

This verification process can be applied
to only part of the block, such as only
applied to the upper page, the middle
page, the lower page, or a combination
of the pages of the affected wordlines
862

Apply the program pulse to re-program
the data back to the location until the
verification passes the verify criteria
864

*FIG. 8B*

DETECTING WHETHER DATA STORED IN A GROUP OF THE MEMORY CELLS AS ONE BIT PER EACH OF THE MEMORY CELLS HAS ERRORS ⎬~1300

BYPASSING ERROR CORRECTION OF THE DATA STORED IN THE GROUP OF MEMORY CELLS IN RESPONSE TO NOT DETECTING THE ERRORS IN THE DATA STORED ⎬~1302

SINGLE-LEVEL MEMORY CELL ERROR ON-CHIP DETECTION

FIELD

This application relates to non-volatile memory apparatuses and the operation of non-volatile memory apparatuses.

BACKGROUND

This section provides background information related to the technology associated with the present disclosure and, as such, is not necessarily prior art.

A memory device or apparatus may program data into memory cells therein. However, there may be problems in reading the data programmed into the cells, either immediately after programming or over time. For example, in the context of flash memory, data programmed into memory cells may degrade due to data retention problems. In addition, error correction of the data may consume significant power. Thus, techniques are needed to overcome such challenges.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells configured to store a threshold voltage corresponding to one of a plurality of data states. The memory apparatus also includes a control means configured to detect whether data stored in a group of the memory cells as one bit per each of the memory cells has errors. The control means is additionally configured to bypass error correction of the data stored in the group of the memory cells in response to not detecting the errors in the data stored.

According to another aspect of the disclosure, a controller in communication with a memory apparatus including memory cells configured to store a threshold voltage corresponding to one of a plurality of data states is provided. The controller is configured to instruct the memory apparatus to detect whether data stored in a group of the memory cells as one bit per each of the memory cells has errors. The controller is also configured to instruct the memory apparatus to bypass error correction of the data stored in the group of the memory cells in response to not detecting the errors in the data stored.

According to an additional aspect of the disclosure a method of operating a memory apparatus is provided. The memory apparatus includes memory cells configured to store a threshold voltage corresponding to one of a plurality of data states. The method includes the step of detecting whether data stored in a group of the memory cells as one bit per each of the memory cells has errors. The method also includes the step of bypassing error correction of the data stored in the group of the memory cells in response to not detecting the errors in the data stored.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7B is a table of a sequence of programming word-lines for the programming sequence illustrated in FIG. 7A according to aspects of the disclosure;

FIG. 8B illustrates a flow chart of a second example of programming data into a section of memory, determining whether to refresh the data, and refreshing part or all of the data according to aspects of the disclosure;

Figure 12:
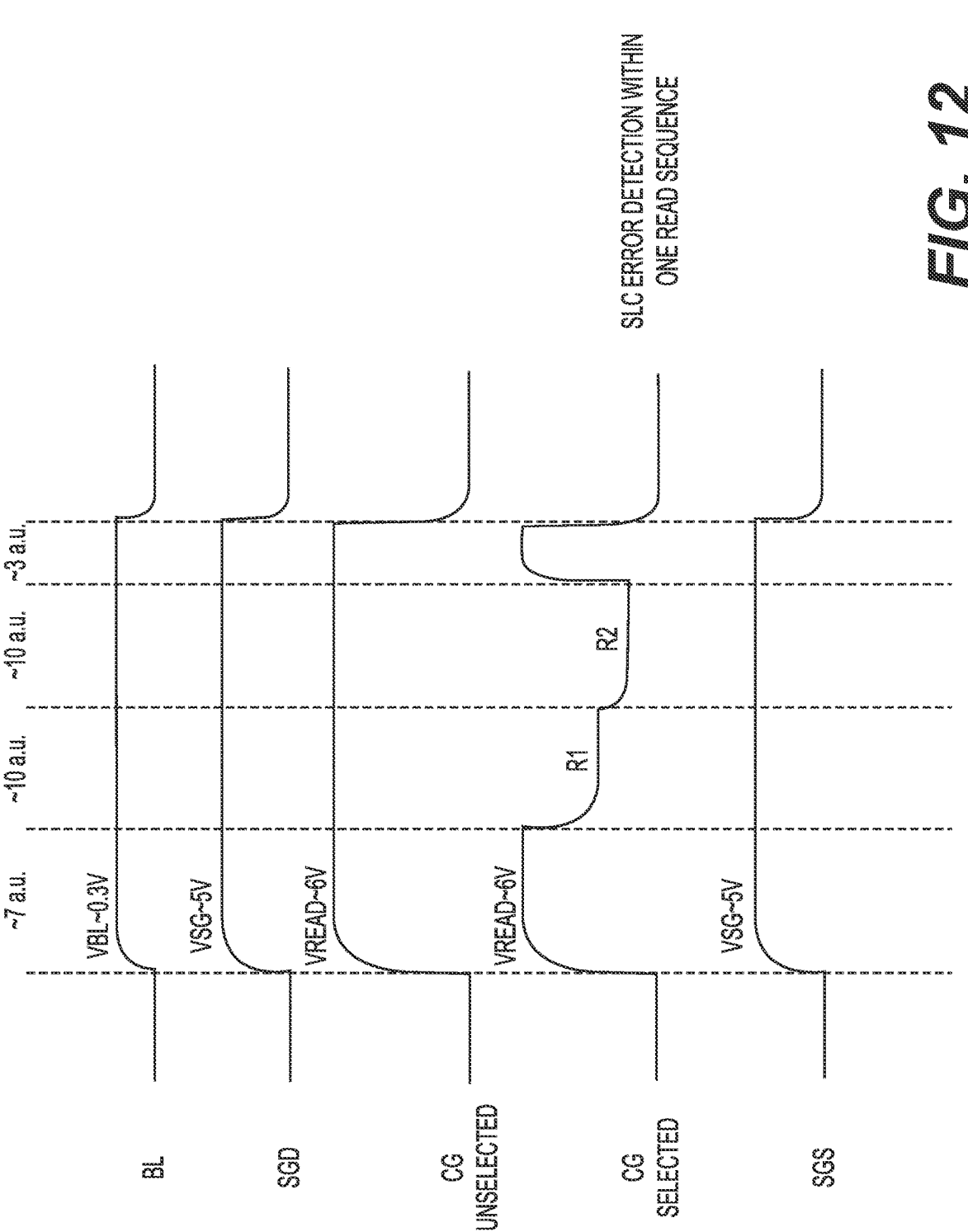
Figure 13:
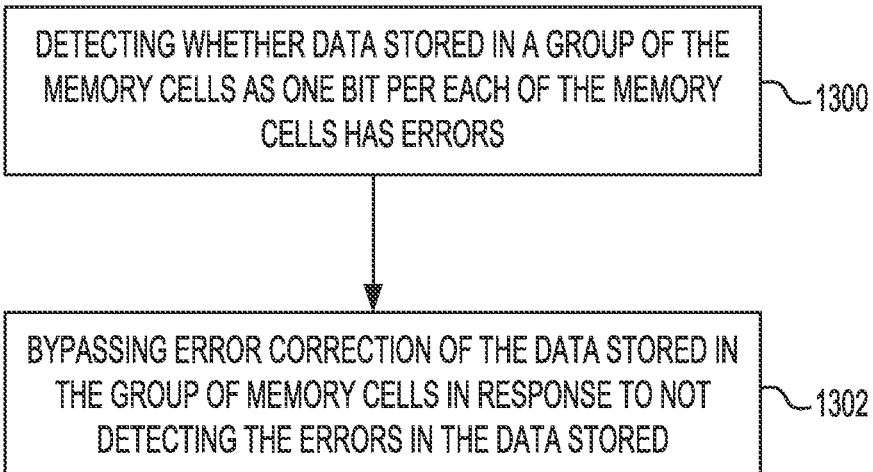
Figure 14:
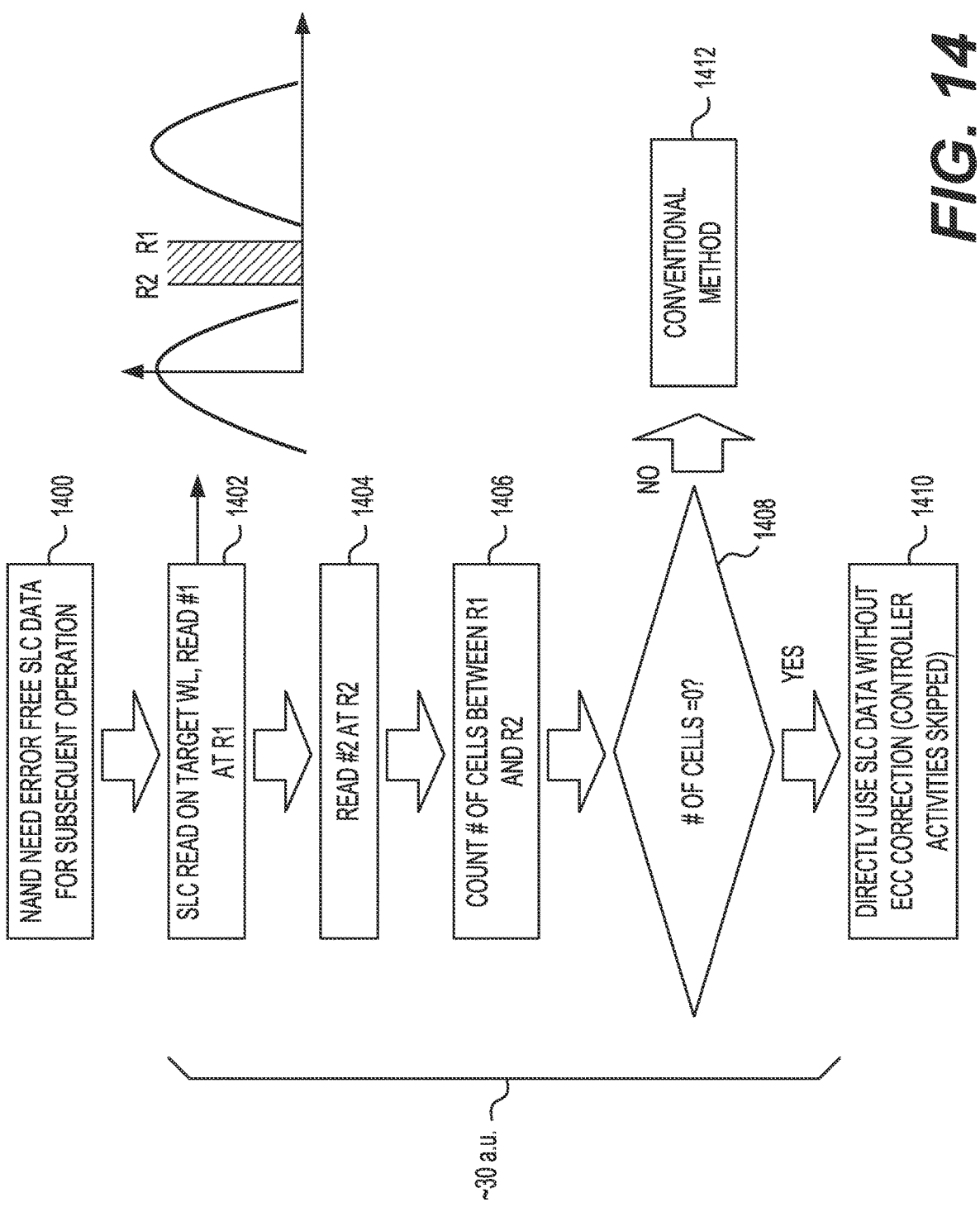
Figure 15:
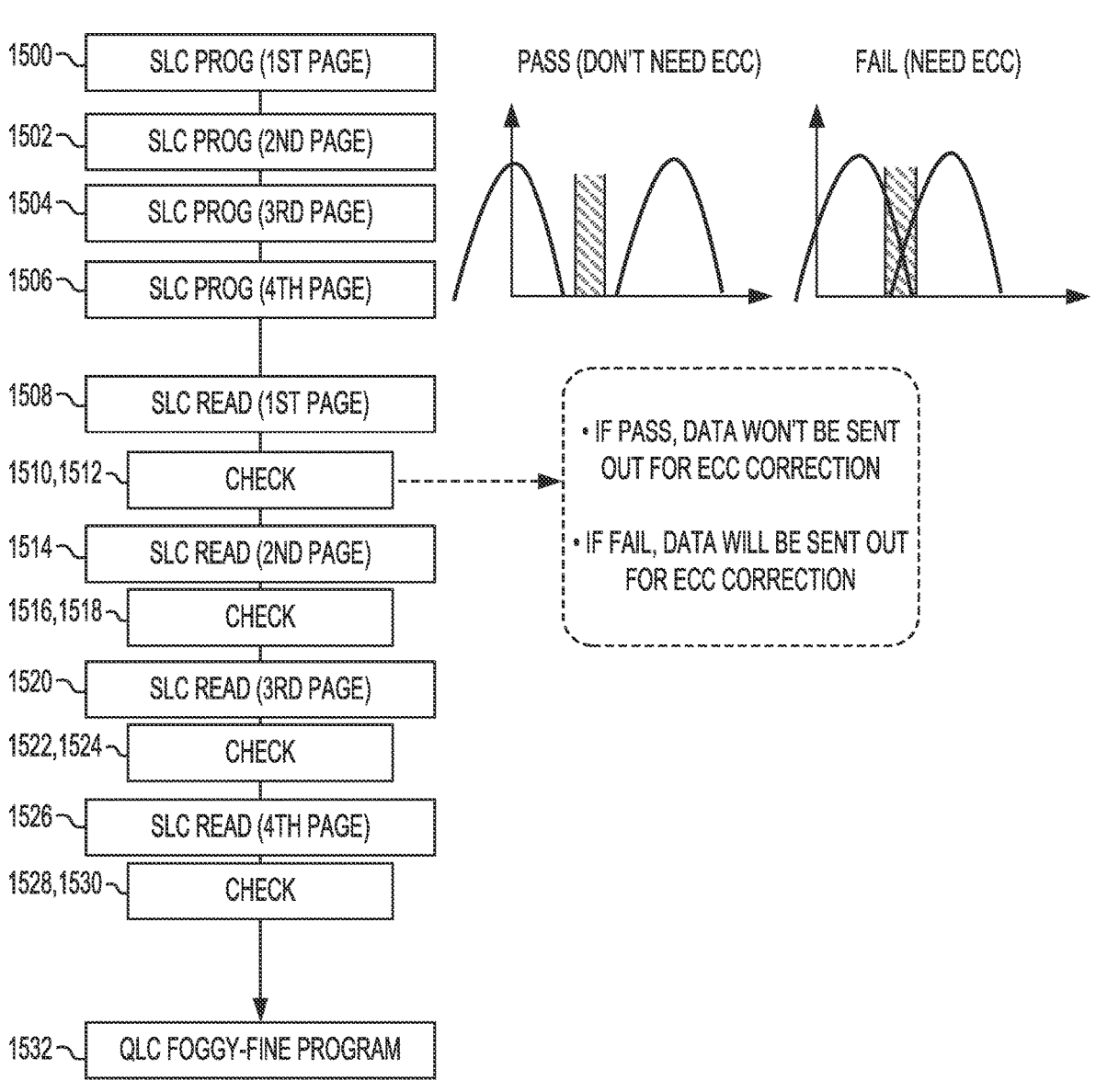

FIG. 12 shows a plot of the voltages applied to a selected one of the bit lines, a drain-side select gate transistor, an unselected word line (CG unselected), a selected word line (CG selected), and a source-side select gate transistor during an example read operation in which the first read and the second read are within one read operation or sequence according to aspects of the disclosure; and FIGS. 13-15 illustrate steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

As discussed in the background, the memory device may program data into memory cells. The memory cells may be programmed to store one bit, or multiple bits, within a respective cell. For example, the memory cells may be operated to store two levels of charge so that a single bit of data is stored in each cell. This is typically referred to as a binary or single level cell (SLC) memory. As another example, the memory cells may be operated to store more than two detectable levels of charge in each charge storage element or region, thereby to store more than one bit of data in each. This latter configuration is referred to as multi-level cell (MLC) memory. One or both types of memory cells may be used in a memory, for example binary flash memory may be used for caching data and MLC memory may be used for longer term storage. Such movement or reprogramming of the data from SLC memory to MLC memory is frequently referred to as folding of data from SLC into MLC.

For example, in an MLC memory cell configured to store 3 bits of information, there are $2^3=8$ possible states necessary to represent the 3 bits. The 8 states (referred to herein as Er, A, B, C, D, E, F, and G, where Er refers to the erase state) are 8 discrete voltage levels ($V_t$) that the cell may be programmed to. An example of the programmed 8 states after being programmed is illustrated as the dashed lines in the graph of FIG. 7A. Likewise, an example of the programmed state for an SLC after being programmed is illustrated as the dashed lines in the graph of FIG. 11. The examples of the number of bits per cell stored are merely for illustration purposes.

However, either immediately or over time, reading the data from the memory cells may result in error. The error in reading may be due to a Vt shift (such as a Vt downshift). More specifically, the Vt shift may occur: at fresh condition immediately after programming of the cell; due to data retention problems; and/or due to heavy cycling of the memory device. For example, after programming of the cell, the Vt may downshift causing an increased fail bit count (FBC) thereby causing system performance to decrease and potentially causing misdetection of high bit error rate (BER) in the memory device.

The Vt downshift phenomenon may cause the Vt distribution of the states to be slightly widened on the tail side, even without data retention problems, discussed below. This type of Vt downshift is typically not a sufficiently severe issue to immediately cause uncorrectable error correction code (UECC), but may cause the fail bit count (FBC) to increase. The increased FBC due to fresh condition Vt downshift may have two negative impacts: (1) as FBC increases at the early life, the memory device read performance may be impacted due to longer error correction coding (ECC) decode time; and (2) there may be a higher chance to cause over-detection for system BER, thereby triggering other system level error handling mechanism (such as read scrub/refresh, CVD, EPWR/RBAX recover, etc.) and retarding overall system performance and introducing additional P/E cycles unnecessarily.

As another example, the Vt may shift due to data retention problems. More specifically, data retention problems may cause the memory device Vt distribution to be widened and down shifted more on the right tail.

As still another example, the Vt may shift due to memory device operations. More specifically, as the memory device is being heavily cycled, program disturb and over programming condition may become increasingly severe, thereby causing the memory device Vt distribution to widen on both the right and left tails, and eventually cause UECC as the memory device has tried to reach the maximum endurance. Thus, the cells may lose charge.

Typically, as the Vt shift worsens, the memory device needs to reprogram the data located in the first block. In particular, a second block, which had been previously erased, would be selected. The memory device would then program the second block with the data originally stored in the first block. Thereafter, the first block would be erased in order to enable other data to be programmed therein.

The memory device determines whether there are errors in part or all of the data in section of memory. In one embodiment, the memory device may determine whether there are errors by reading part or all of the section of memory and determining errors in the read. Errors in the read may be determined in one of several ways. One way is to use an error correction coding (ECC) engine to generate a bit error rate (BER), other ways are discussed in more detail below. For the data to be checked by the ECC engine, it typically needs to be read and transferred to the controller, checked for errors, and transferred back to the memory cells. Such operations consume significant power.

Figure 1A:
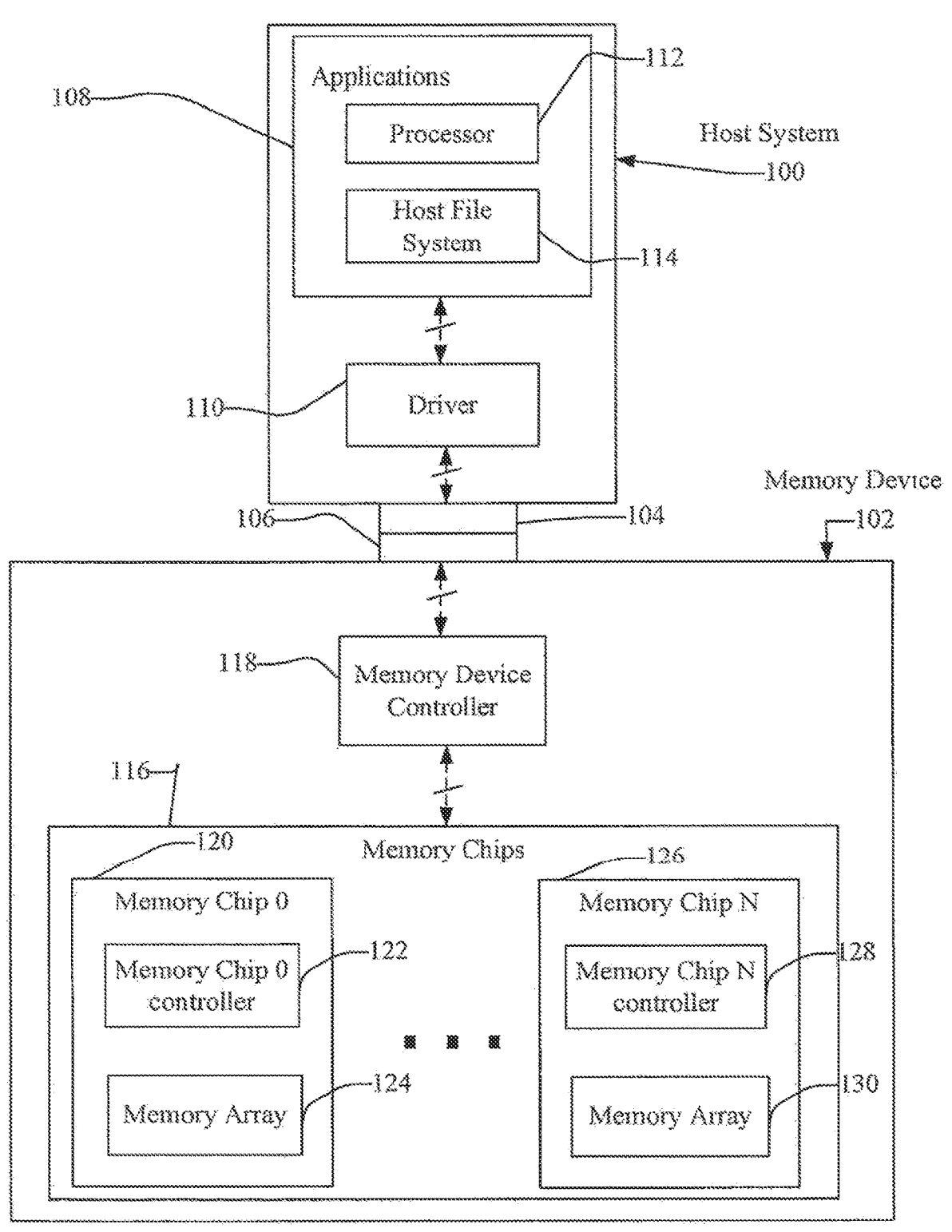
FIG. 1A illustrates a host system connected with a memory device according to aspects of the disclosure.

Referring to the figures, FIG. 1A illustrates a host system 100 and a memory device 102. The host system 100 may comprise any type of host device, such as a stationary computer system (e.g., a desktop computer) or a mobile computer system (e.g., a laptop computer, a smartphone, a tablet computer, or the like).

The host system 100 of FIG. 1A may be viewed as having two major parts, insofar as the memory device 102 is concerned, made up of a combination of circuitry and software. They are an applications portion 108 and a driver portion 110 that interfaces with the memory device 102. In a desktop computer, laptop computer, smartphone, tablet computer, for examples, the applications portion 110 may include a processor (e.g., a CPU) 112 running word processing, graphics, control or other popular application software, as well as the file system 114 for managing data on the host system 100. In a camera, cellular telephone or other host system that is primarily dedicated to performing a single set of functions, the applications portion 108 includes the software that operates the camera to take and store pictures, the cellular telephone to make and receive calls, and the like.

The memory device 102 of FIG. 1A may comprise a semiconductor memory device. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EE-PROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory device can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). One example of three dimensional memory is three dimensional flash memory.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Referring back to FIG. 1A, the memory device 102 may include non-volatile memory, such as flash memory 116 (which may be in the form of one or more memory chips), and a system controller 118 that both interfaces with the host system 100 to which the memory device 102 is connected for passing data back and forth, and controls the flash memory 116. As discussed above, other types of non-volatile memory are contemplated, such as resistive memory, which may be composed of a plurality of resistive memory cells, and ferroelectric memory.

The memory device 102 may take one of several forms. In one form, the memory device 102 may comprise an embedded device. For example, the memory device 102 may comprise a non-volatile memory configured for use as an internal or embedded SSD drive may look similar to the schematic of FIG. 1A, with the primary difference being the location of the memory device 102 internal to the host system 100. An SSD may be in the form of discrete modules that are drop-in replacements for rotating magnetic disk drives. Alternatively, the memory device 102 may be in the form of a card that is removably connected to the host system 100 through mating parts 104 and 106 of a mechanical and electrical connector as illustrated in FIG. 1A.

As discussed above, the memory device 102 of FIG. 1A may comprise a semiconductor memory device and include non-volatile memory, such as one or more memory chips 116, and a memory device controller 118. In an alternate embodiment, the memory device 102 may include both volatile and non-volatile memory.

The host system 100 may communicate with the memory device for multiple purposes. One purpose is for the host system 102 to store data on and/or read data from the memory device. For example, the host system 100 may send data to the memory device 102 for storage on the one or more memory chips 116 of the memory device 102. As another example, the host system 100 may request data from the memory device 102 that is stored on the one or more memory chips 116. When communicating with the memory device, the host system 100 may send logical addresses of data, such as in the form of a range of logical block addresses (LBAs). The memory device controller 118 may then convert the LBAs, in one or more steps, to the actual physical addresses on the memory chips 116. The memory device controller 118 may perform a logical address-to-actual physical address conversion in order to map to the actual physical addresses. For example, the LBAs from the host system 100 may be mapped to memory device internal logical addresses, and the memory device internal logical addresses are mapped to the actual physical addresses. As another example, the LBAs from the host system 100 may be mapped directly to the actual physical addresses.

FIG. 1A illustrates that the non-volatile memory 116 includes a plurality of memory chips, including memory chip 0 (120) and memory chip N (126). Memory chip 0 (120) includes memory chip 0 controller 122 and memory array 124. Likewise, memory chip N (126) includes memory chip N controller 128 and memory array 130. As discussed in more detail below, memory chip controller may comprise circuitry and/or software to control operations on the respective memory chip. Further, in one embodiment, memory array may include the memory cells on a respective memory chip.

Figure 1B:
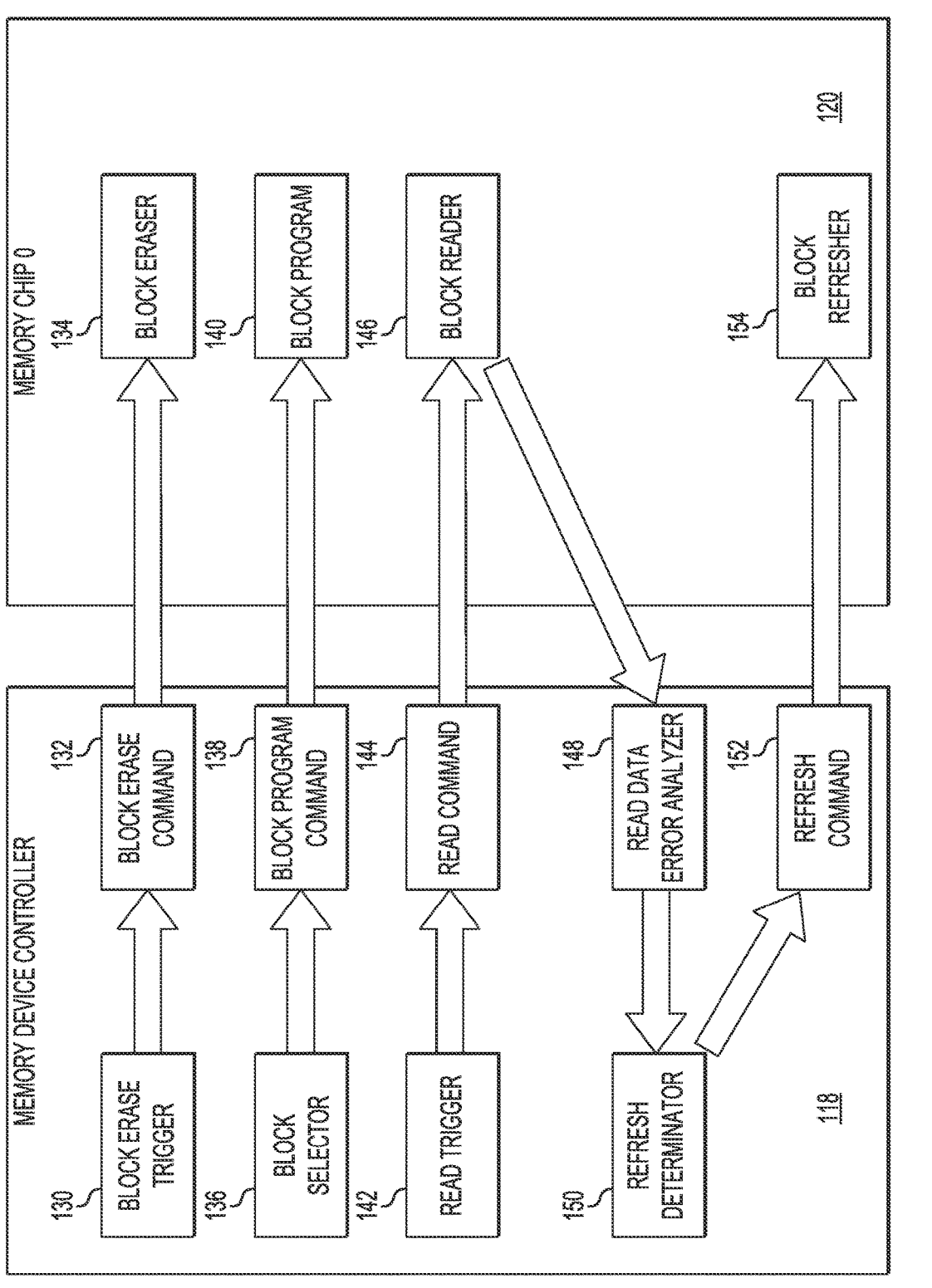
FIG. 1B illustrates another block diagram of the memory device controller and the memory chip of FIG. 1A according to aspects of the disclosure.

FIG. 1B illustrates another block diagram of the memory device controller 118 and the memory chip 0 (120) of FIG. 1A. Memory chip 0 (120) is illustrated for purposes of example only. As shown in FIG. 1B, in one embodiment, the memory device controller 118 may command the program of a section of memory (such as a block), and may thereafter determine whether to refresh the data in the block. To that end, the host system 100 may include a block erase trigger 130, a block erase command 132, a block selector 136, a block program command 138, a read trigger 142, a read command 144, a read data error analyzer 148, a refresh determinator 150, and a refresh command 152. Any one, any combination, or all of the block erase trigger 130, the block erase command 132, the block selector 136, the block program command 138, the read trigger 142, the read command 144, the read data error analyzer 148, the refresh determinator 150, and the refresh command 152 can be implemented as software, hardware, or a combination of hardware and software.

The memory chip 0 (120) may include a block eraser 134, a block program 140, a block reader 146, a block refresher 154. Any one, any combination, or all of the block eraser 134, the block program 140, the block reader 146, the block refresher 154 can be implemented as software, hardware, or a combination of hardware and software.

The block erase trigger 130 may comprise the trigger for selecting a block in the memory array to erase. In response to the trigger from block erase trigger 130, the block erase command 132 may generate an erase command to send to the memory chip 0 (120) to erase the selected block. In response to receiving the erase command, the block eraser 134 erases the selected block. The block selector 136 is configured to select a block for programming data. In turn, the block program command 138 generates a command to send to memory chip 0 (120) to program the block. In response to receive the command, block program 140 programs the block.

The memory device controller 118 may use read trigger 142 to read the data from the memory chip 0 (120). The read trigger 142 may trigger a read based on a request from the host system 100 to read the data, or based on an internal request. In response to the trigger for a read, the read command 144 sends a command to the memory chip 0 (120). Block reader 146 reads the block (or a sub part of the block) and sends the data for error analysis by read data error analyzer 148. As discussed in more detail below, one example of read data error analyzer 148 may be a ECC engine which may generate a BER. The refresh determinator 150 may analyze the output from read data error analyzer 148 in order to determine whether to refresh part or all of the block of memory. For example, the read data error analyzer 148 may compare the BER generated from the ECC engine with a threshold to determine whether to order a refresh. In response to determining to refresh part or all of the block, the refresh command 152 sends a command to memory chip 0 (120), which may use block refresher 154 to refresh part or all of the block.

Figure 1C:
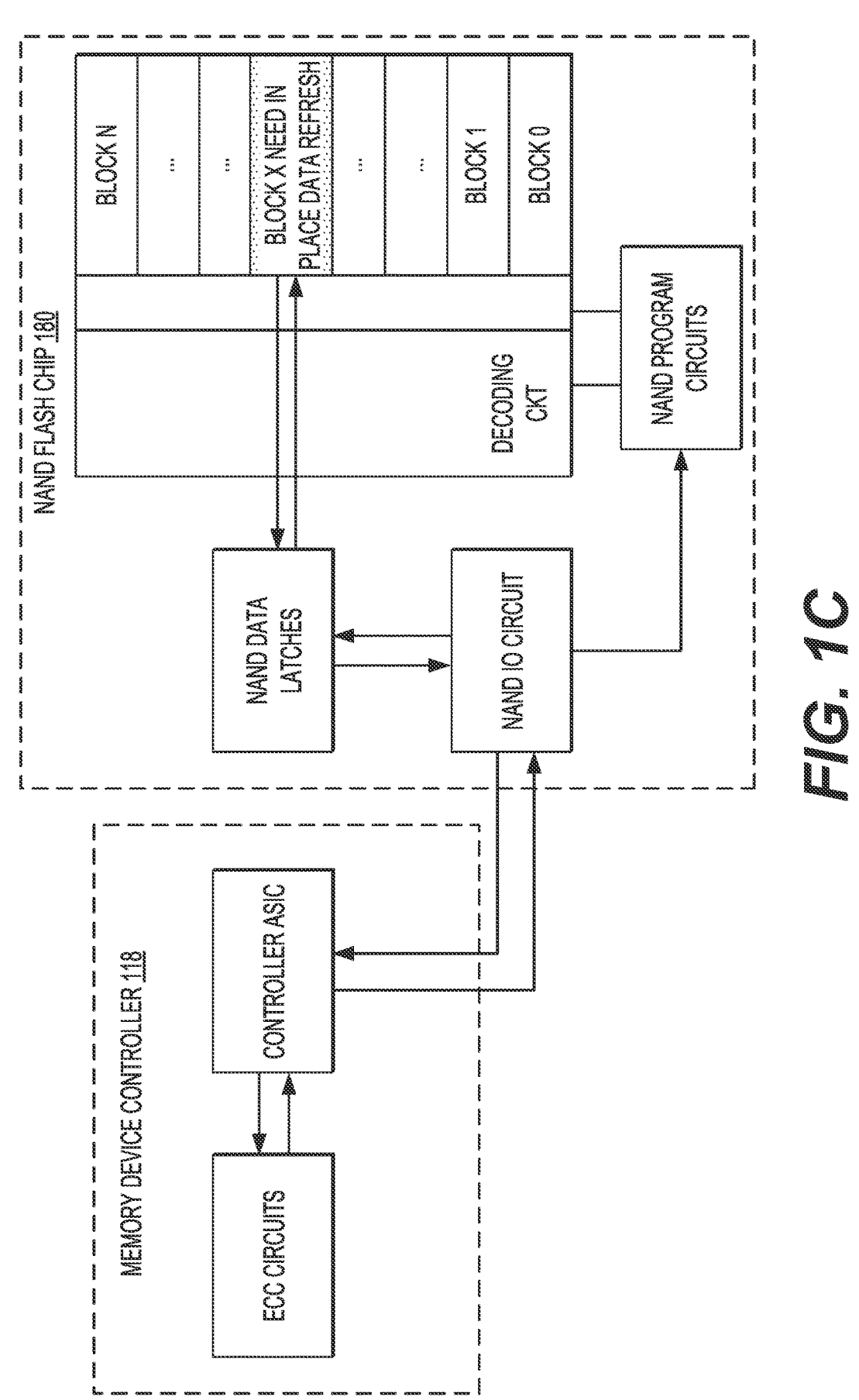
FIG. 1C illustrates a data flow of the refresh within the memory device controller and the memory chip according to aspects of the disclosure.

FIG. 1C illustrates a data flow of the refresh within the memory device controller and the memory chip. In refreshing the data, the controller ASIC of the memory device controller 118 sends a command to the NAND I/O circuit. The command includes an indication that the command is for refresh, data for the refresh, an indication as to the block (or sub-block) for refresh, and optionally one or more programming voltages for the refresh, as discussed in more detail below. The NAND I/O circuit may send an indication to the NAND programming circuits that the operation is a refresh (as opposed to a program from an erased block) and an indication as to the section within the memory array for the program (e.g., the wordlines for program as discussed below). In turn the NAND program circuits use the decoding circuit to select the selection of memory (e.g., wordline(s), block) for program. The NAND I/O circuit further sends the data to the NAND data latches in order to latch the data for programming.

After verification, the data from the refreshed section (e.g., the refreshed wordline(s) or block) may be read out and sent to the controller ASIC. The controller ASIC may send the read out data to the ECC circuits for error analysis (e.g., the ECC circuits may generate the BER). The controller ASIC may receive the BER and then the BER. In one embodiment, the controller ASIC may compare the BER with a predefined threshold defined as a successful refreshing of the section of memory. If the BER is less than the predefined threshold, the controller ASIC may order the refresh be performed again. Alternatively, if the BER is less than the predefined threshold, the controller ASIC may order to block be reprogrammed.

Figure 2A:
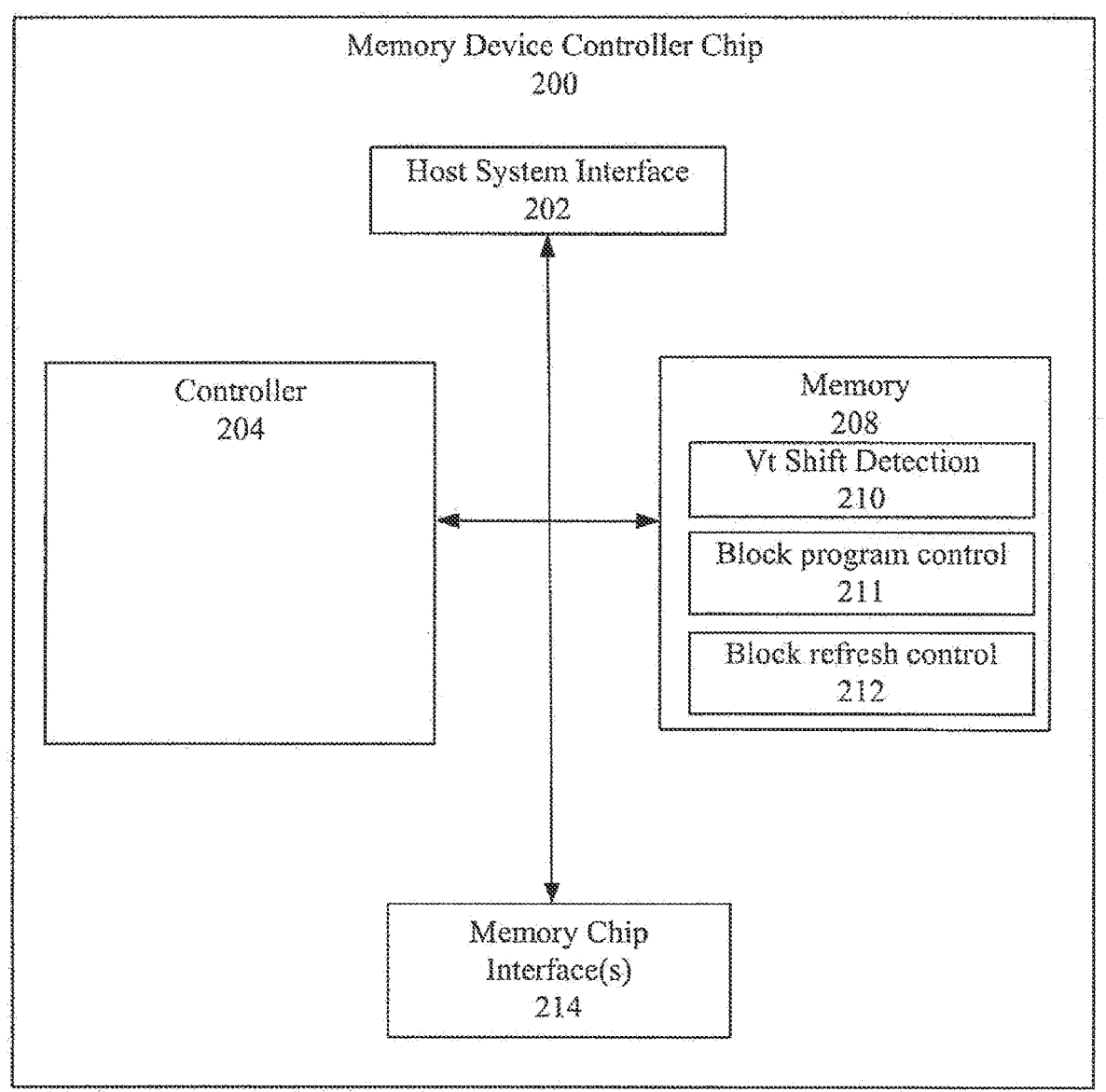
FIG. 2A illustrates memory device controller chip, which is a first example of memory device controller depicted in FIG. 1A according to aspects of the disclosure.

FIG. 2A illustrates memory device controller chip 200, which is an example of memory device controller 118 depicted in FIG. 1A. As illustrated in FIG. 2A, memory device controller chip 200 includes host system interface 202, which may comprise circuitry and/or software in order to communicate with the host system 100. Alternatively, host system interface 202 may be external to memory device controller chip 200. Memory device controller chip 200 further includes controller 204, memory 208, and memory chip interface(s) 214. Memory 208 may include Vt shift detection 210, block program control 211, and block refresh control. Vt shift detection 210 may comprise software that is executable by controller 204 to detect a shift (such as a downshift) in Vt for a section of memory, such as in a block or in a sub-block. Block program control 211 may comprise software that is executable by controller 204 to control the memory chips 116 to program a block, as discussed in more detail below. Block refresh control 212 may comprise software that is executable by controller 204 to control the memory chips 116 to refresh a block (or a part of a block), as discussed in more detail below. Memory chip interface 214 may comprise one or more communication lines configured to communicate with one or more memory chips.

Figure 2B:
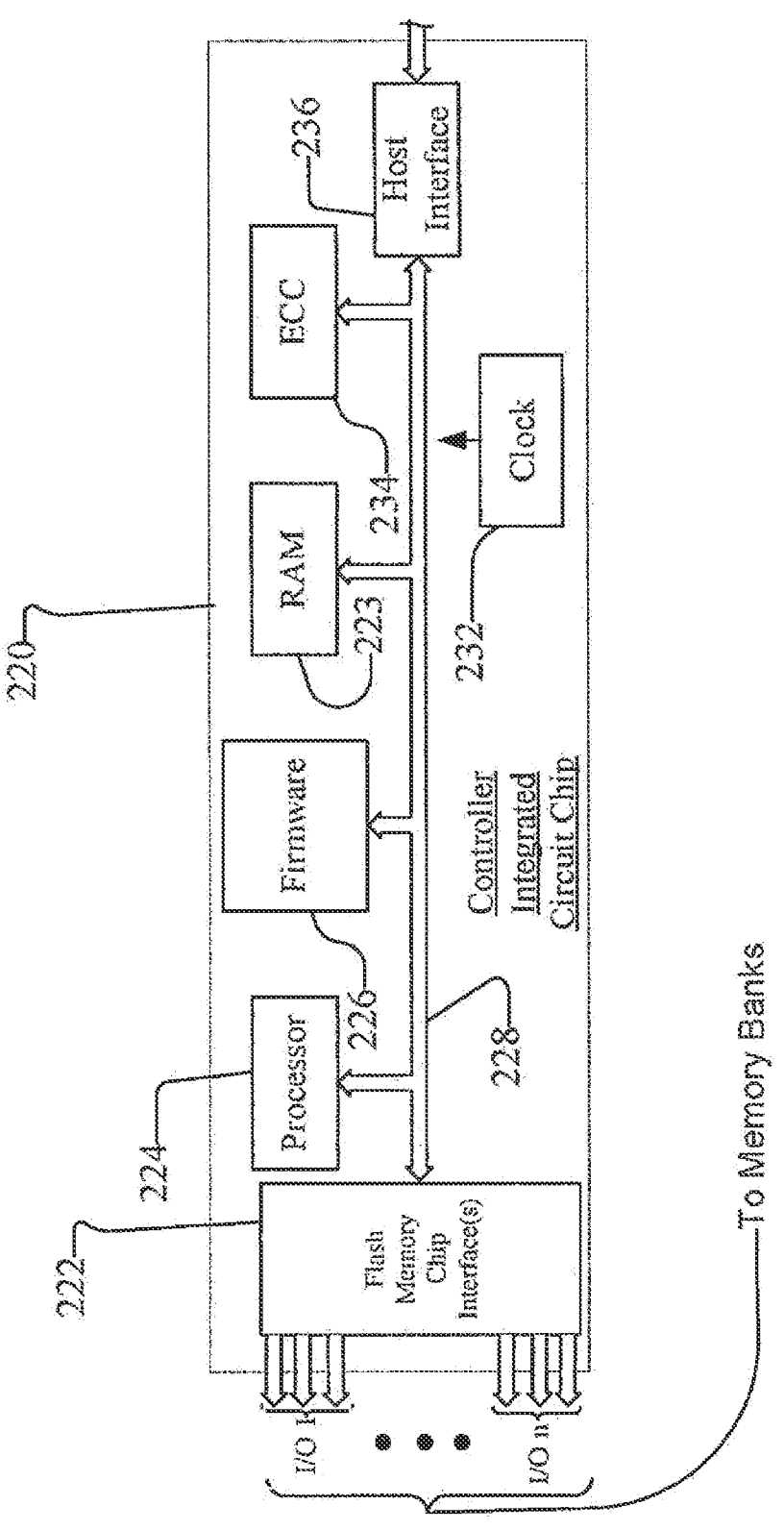
FIG. 2B illustrates memory device controller chip, which is a second example of memory device controller depicted in FIG. 1A according to aspects of the disclosure.

FIG. 2B illustrates memory device controller chip 220, which is a second example of memory device controller 118 depicted in FIG. 1A. The memory device controller chip 220 may be implemented on a single integrated circuit chip, such as an application specific integrated circuit (ASIC), as shown in FIG. 2B. Further, the various functions performed by the memory device controller chip 220 may be performed by a single device, or may be performed by multiple devices, such as shown in FIG. 2B. More specifically, the memory device controller chip 220 may be segmented into the different devices illustrated in FIG. 2B, such as flash memory interface(s) 222, processor 224, RAM 230, ECC 234, host interface 236, and clock 232. FIG. 2B is merely for illustration purposes.

The processor 224 of the memory device controller chip 220 may be configured as a multi-thread processor capable of communicating separately with a respective memory chip via one or more flash memory interface(s) 222. The flash memory interface(s) 222 may have I/O ports for each of the respective memory chips in the flash memory 116. The memory device controller chip 220 may include an internal clock 232. The processor 224 may communicate with an error correction code (ECC) module 234 (discussed in more detail below), a RAM buffer 230, a host interface 236, and firmware 226 (which may include boot code ROM) via an internal data bus 228.

Figure 3A:
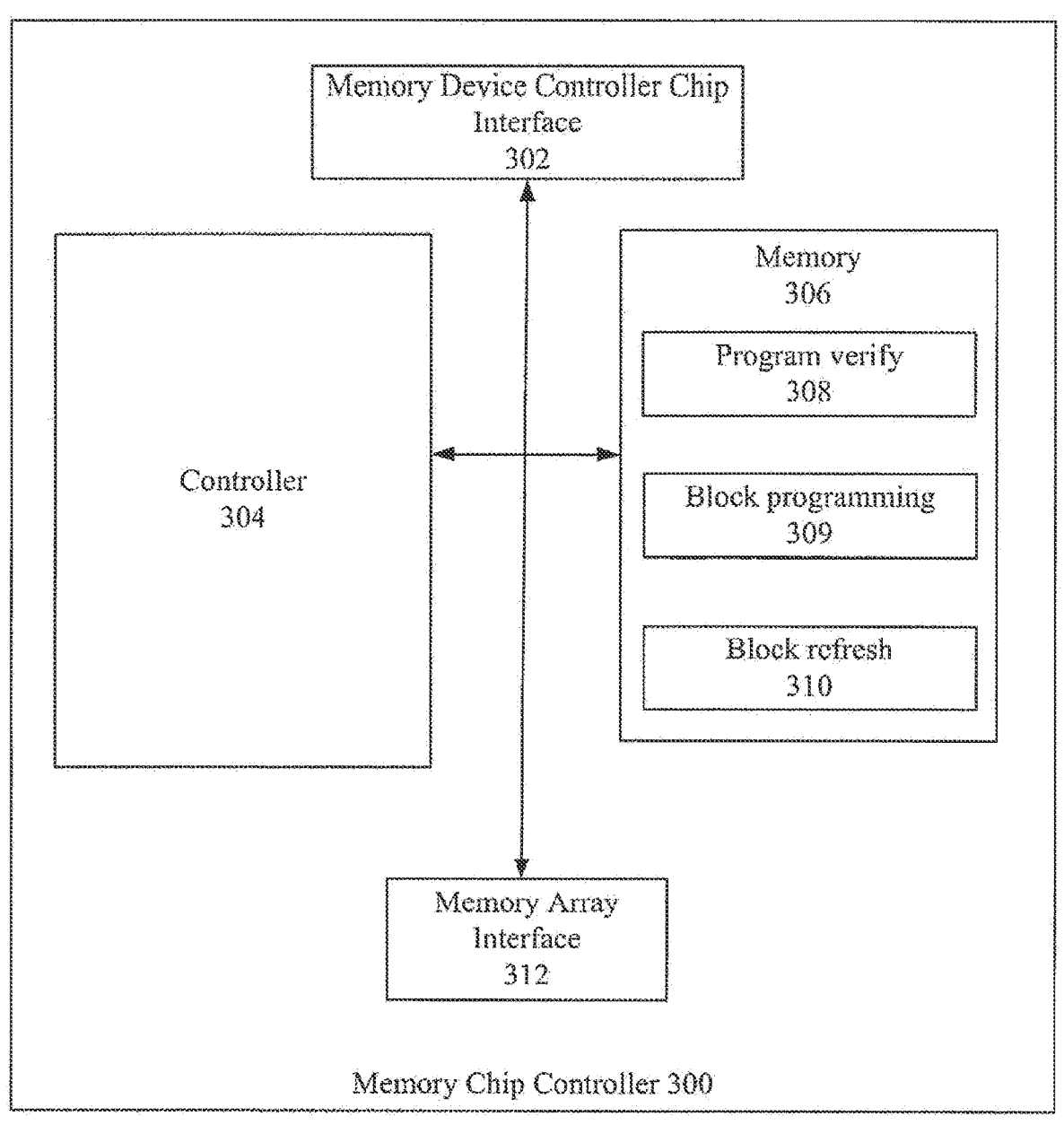
FIG. 3A illustrates an example of memory chip controller depicted in FIG. 1A according to aspects of the disclosure.

FIG. 3A illustrates an example of memory chip controller 300, such as memory chip 0 controller 122, depicted in FIG. 1A. Memory chip controller 300 includes memory device controller chip interface 302, which is the interface with memory device controller chip 200. Memory chip controller 300 further includes controller 304 and memory 306. Memory 306 may include program verify 308, block programming 309, and block refresh 310.

Program verify 308 may be used to verify whether the data programmed into one or more memory cells has been successfully programmed. As discussed in more detail below, a program verify test may comprise a read operation in which a verity voltage (Vread) is applied and the current through the cell is compared to verify current of the program verify test (Iverify_set) or a reset verify current of the program verify test (Iverify_reset) to determine whether the set or reset state, respectively, has been reached. Program verify 308 may determine whether the program verify test has been passed. If it is determined that the program verify test has not been passed, in one embodiment, an error may be returned, and in an alternate embodiment, one or more values for the programming parameters may be updated, such as by increasing the voltage magnitude and/or duration and/or the current limit, and the programming may be performed again.

Block programming 309 may be used to program a block (or program a part of a block), as discussed in more detail below. Block refresh 310 may be used to refresh the data previously programmed in a block (or refresh a part of a block), as discussed in more detail below. Memory array interface 314 may comprise the interface to the memory array, such as memory array 124.

Figure 3B:
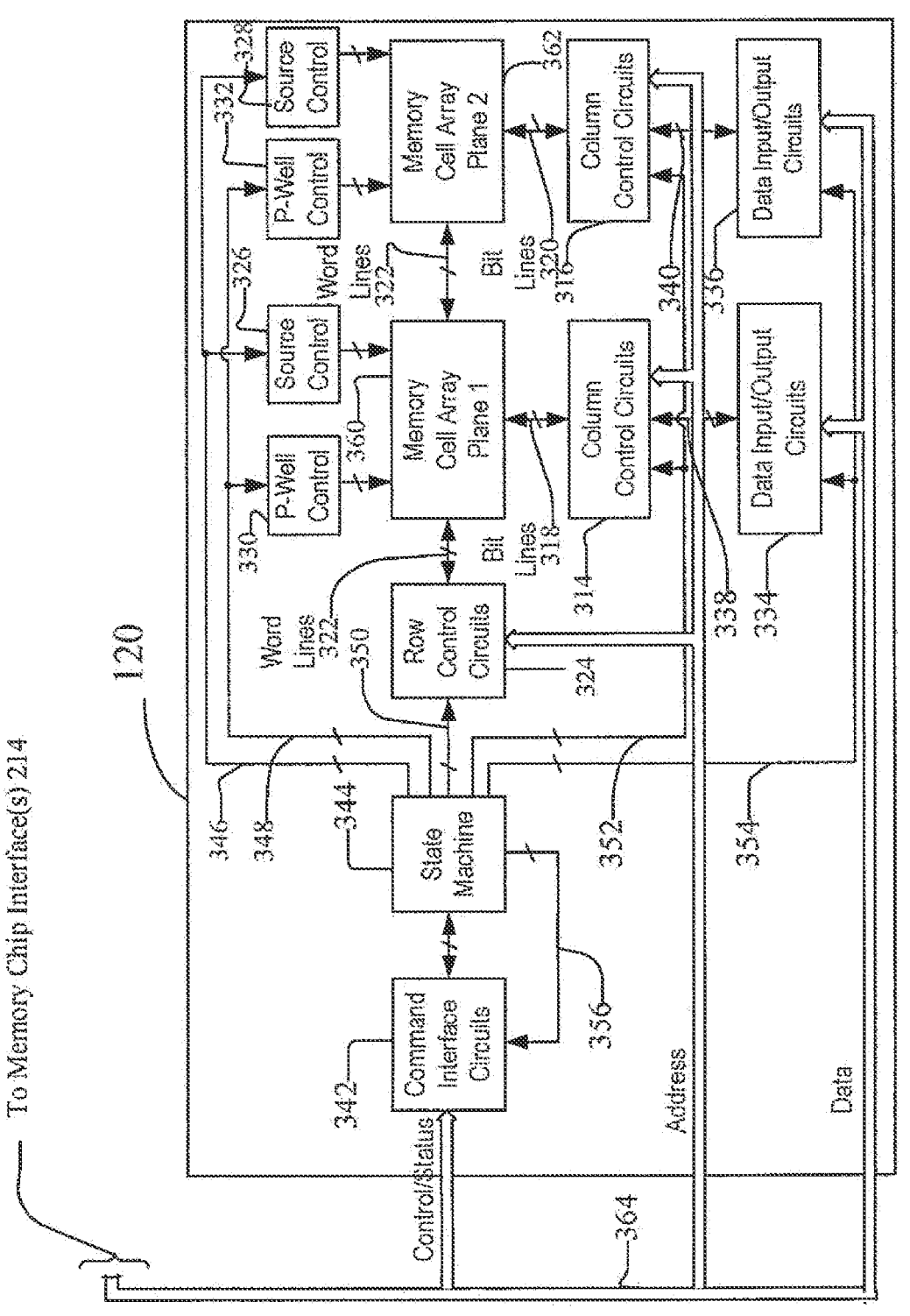
FIG. 3B illustrates an example of a block diagram of a memory chip, such as used in the memory depicted in FIG. 1A according to aspects of the disclosure.

FIG. 3B illustrates an example of a block diagram of a memory chip, such as used in flash memory chip 0 (120) depicted in FIG. 1A. Each memory chip may contain an array of memory cells organized into multiple planes. FIG. 3B shows planes 360 and 362 for simplicity but a lesser number, such as one plane or a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array, and decode them to address a specific one or more of respective bit lines 318 and 320. The word lines 322 are addressed through row control circuits 324 in response to addresses received on the bus 364. Source voltage control circuits 326 and 328 are also connected with the respective planes, as are p-well voltage control circuits 330 and 332. If the bank is in the form of a memory chip with a single array of memory cells, and if two or more such chips exist in the system, data are transferred into and out of the planes 360 and 362 through respective data input/output circuits 334 and 336 that are connected with the bus 364. The circuits 334 and 336 provide for both programming data into the memory cells and for reading data from the memory cells of their respective planes, through lines 338 and 340 connected to the planes through respective column control circuits 314 and 316.

Although the controller 204 in the memory device chip controller 200 controls the operation of the memory chips to program data, read data, refresh data, erase and attend to various housekeeping matters, each memory chip also contains some controlling circuitry that executes commands from the memory device controller 118 to perform such functions, such as programming functionality, refresh functionality, and program verification functionality. Interface circuits 342 are connected to the bus 364. Commands from the memory device controller 118 are provided to a state machine 344 that then provides specific control of other circuits in order to execute these commands. State machine 344 may further include error determination functionality, such as discussed herein. Control lines 346-354 connect the state machine 344 with these other circuits as shown in FIG. 3B. Status information from the state machine 344 is communicated over lines 356 to the interface 342 for transmission to the memory device controller 118 over the bus 364.

A NAND architecture of the memory cell arrays 360 and 362 is discussed below, although other non-volatile memory architectures or technologies, alone or combination, such as NOR, can be used instead. An example NAND array is illustrated by the circuit diagram of FIG. 4, which is a portion of the memory cell array 360 of the memory bank of FIG. 3B. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
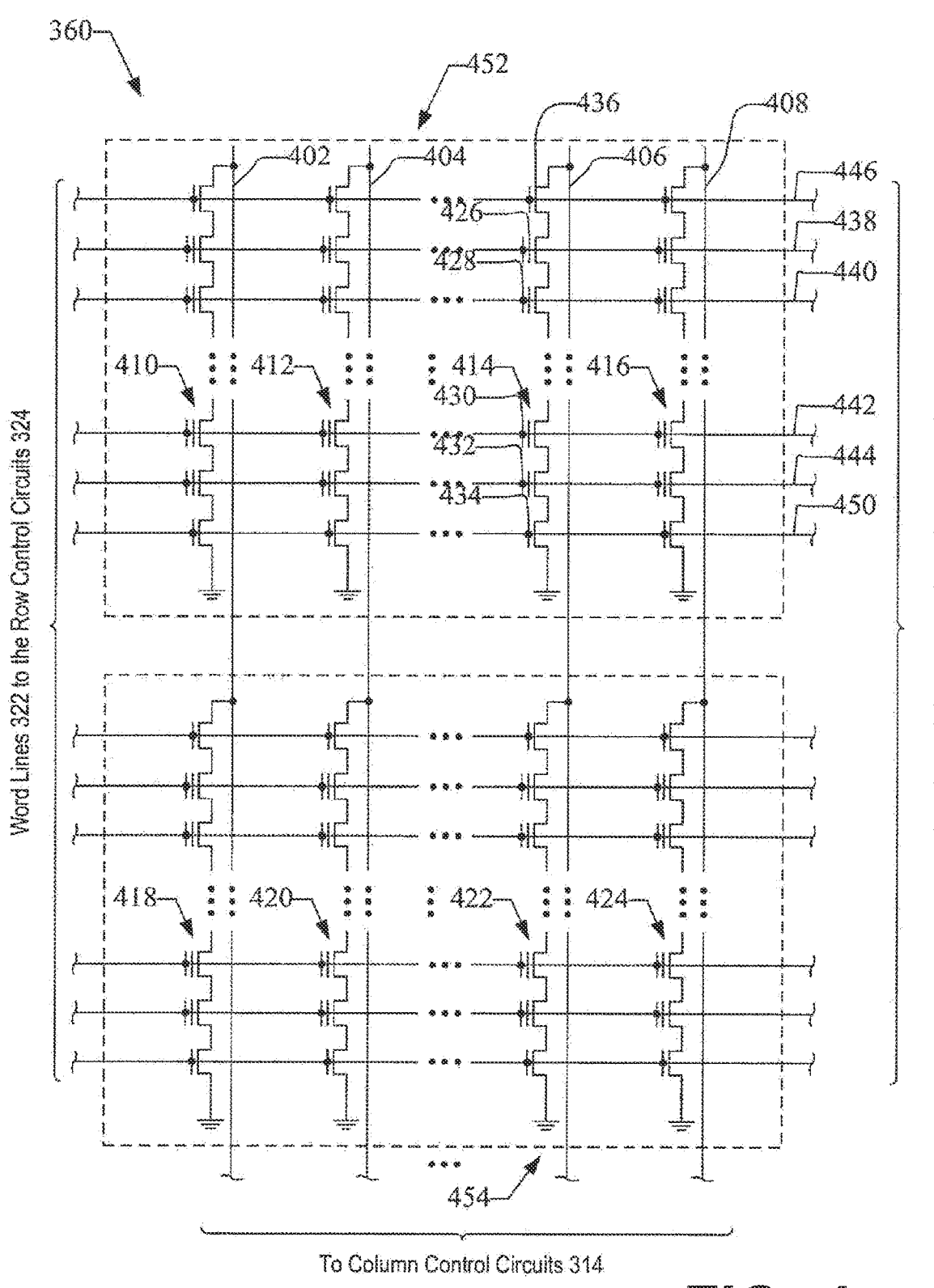
FIG. 4 is a representative circuit diagram of a memory cell array that may be used in the memory bank of FIG. 3B according to aspects of the disclosure.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, may be programmed in parallel at a time. Typically, the rows of a NAND array are programmed in a prescribed order, in this case beginning with the row along the word line 444 closest to the end of the strings connected to ground or another common potential. The row of memory cells along the word line 442 is programmed in parallel next, and so on, throughout the block 452. The row along the word line 438 is programmed in parallel last.

A row of memory cells is merely one example of a parallel programming unit. The parallel programming unit may include one or both of the following: (1) all physical structures (such as memory cells) can be programmed/read in parallel; and (2) all physical structures can be programmed/read with the same or similar completion time. Element (2) is for purposes of efficiency, although not required for a parallel programming unit.

The row of memory of memory cells may be composed of cells that are in the same physical location on a die. Alternatively, the row of memory cells may be composed of cells that are in different physical locations on die or dies that are all programmable in parallel. Moreover, other parallel programmable units are contemplated in which memory cells may be programmed in parallel.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3B, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
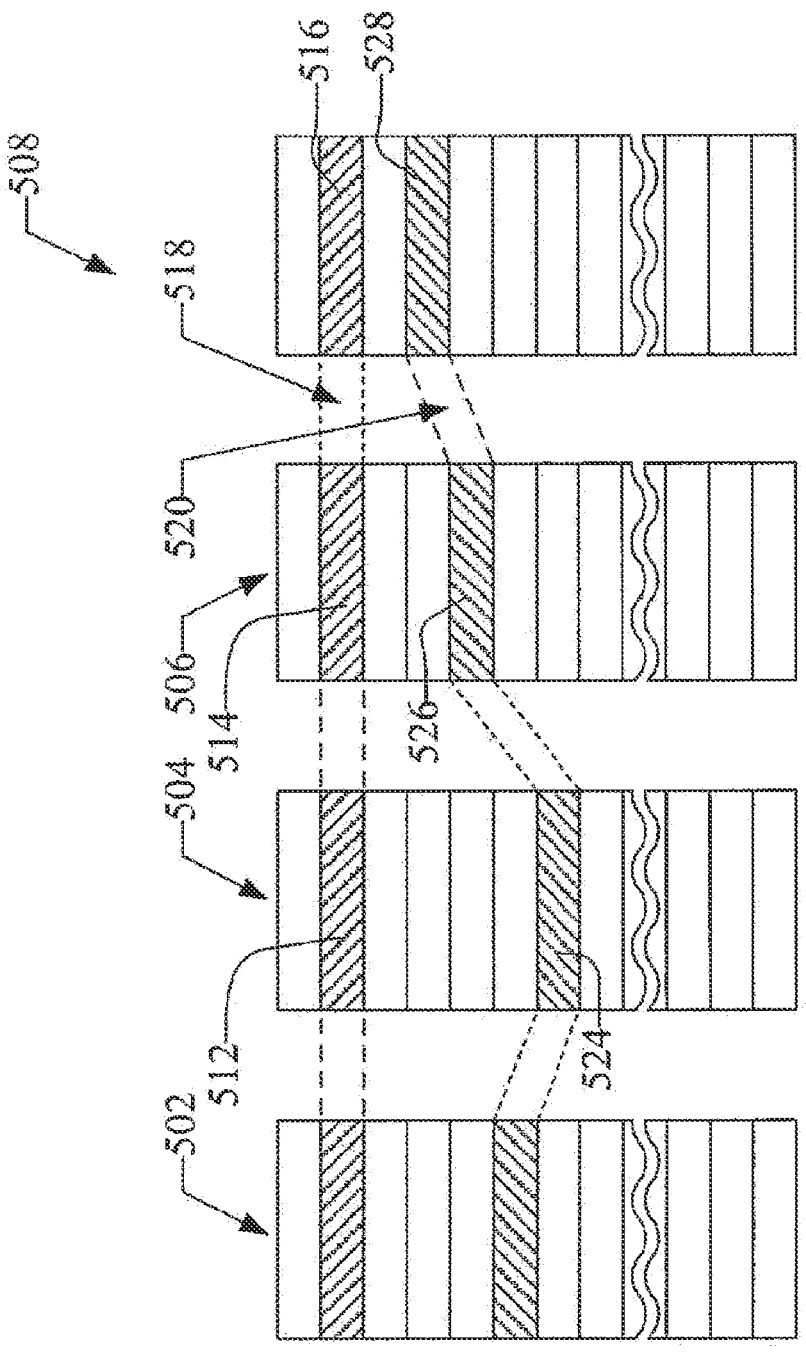
FIG. 5 illustrates an example physical memory organization of the memory bank of FIG. 3B according to aspects of the disclosure.

FIG. 5 conceptually illustrates an organization of one bank of the multi-bank flash memory that is used as an example in further descriptions below. Four planes 502-508 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into blocks of memory cells shown in FIG. 5 by rectangles, such as blocks 510, 512, 514 and 516, located in respective planes 502-508. There can be hundreds or thousands of blocks in each plane.

As mentioned above, the block of memory cells is the unit of erase, the smallest number of memory cells that are physically erasable together. For increased parallelism, however, the blocks may be operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory device can be operated with the ability to dynamically form metablocks of any or all of one, two or three blocks in different planes. This allows the size of the metablock to be more closely matched with the amount of data available for storage in one programming operation.

Figure 6:
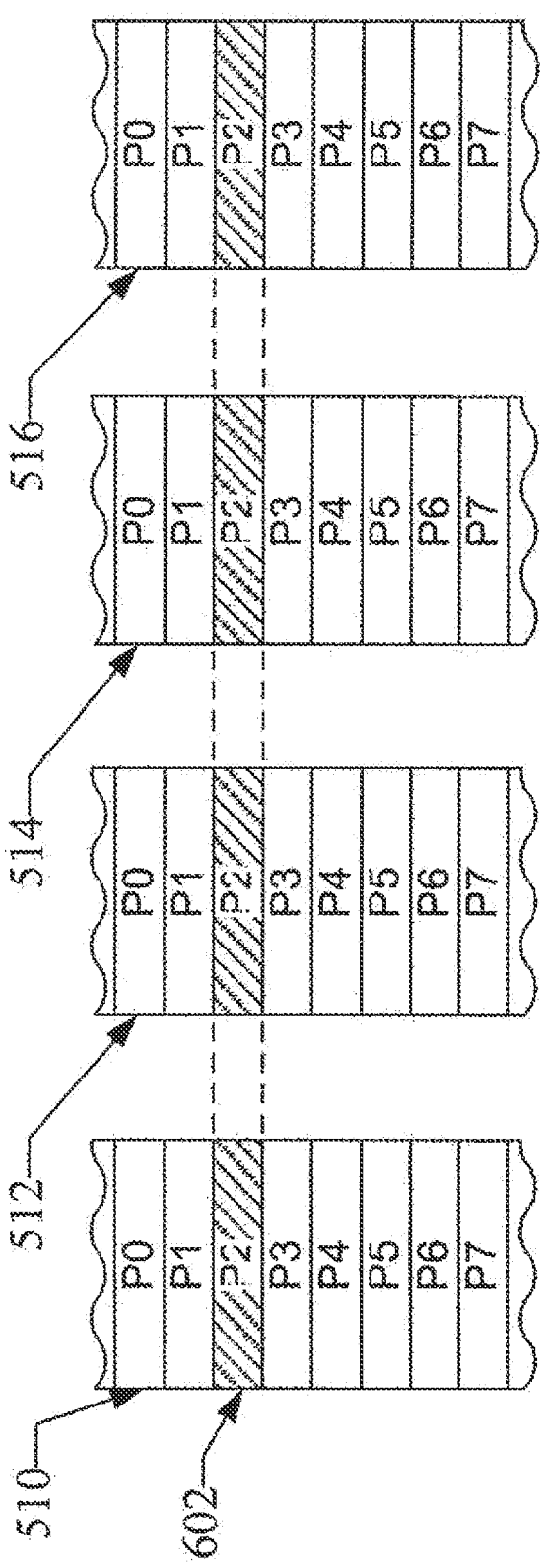
FIG. 6 shows an expanded view of a portion of the physical memory of FIG. 5 according to aspects of the disclosure.

The individual blocks are in turn divided for operational purposes into pages of memory cells, as illustrated in FIG. 6. The memory cells of each of the blocks 510-516, for example, are each divided into eight pages P0-P7. Alternatively, there may be 16, 32 or more pages of memory cells within each block. The page is the unit of data programming within a block, containing the minimum amount of data that are programmed or read at one time. In the NAND architecture of FIG. 3B, a page is formed of memory cells along a word line within a block. However, in order to increase the memory device operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a bank, a metapage is the maximum unit of programming.

Figure 7A:
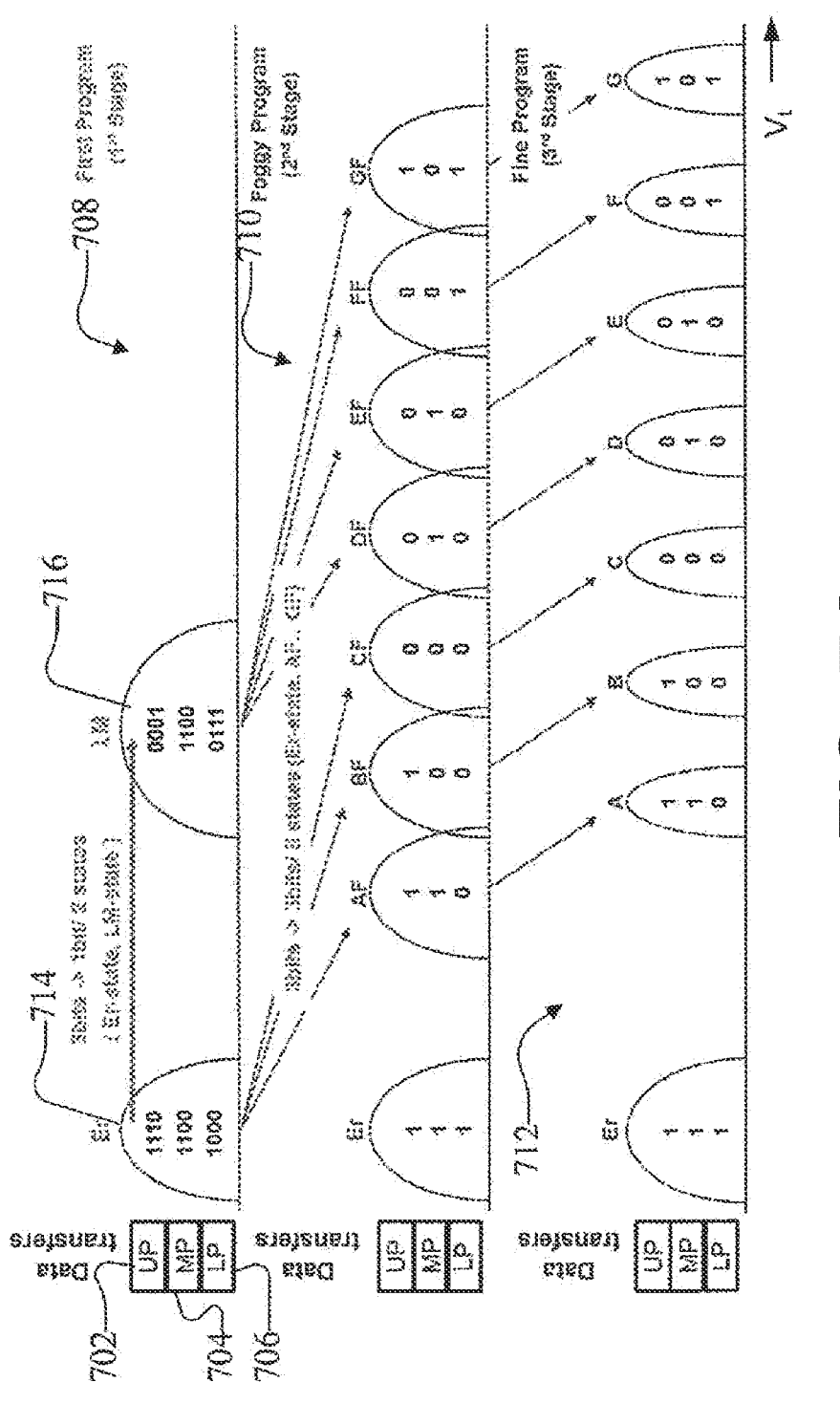
FIG. 7A illustrates an example non-volatile memory programming chart illustrating target voltage levels for each stage of a three stage NAND flash programming operation in a three bit-per-cell memory according to aspects of the disclosure.

FIG. 7A illustrates programming of a 3-bit-per-cell NAND flash memory. The example of FIG. 7A is merely for illustration purposes. Other numbers of bits-per-cell and other types of memory are contemplated. Referring to FIG. 7A, each cell in a WL for a 3 bit-per-cell NAND flash memory may store a bit from each of 3 different pages: an upper page bit (UP) 702 a middle page bit (MP) 704 and a lower page bit (LP) 706. A typical programming operation for such a memory cell would require that the 3 original bits of host data intended for that cell be transferred from the controller to the NAND memory three times, one time for each of three programming passes needed to nudge the correct amount of charge into the cell to reach the desired voltage state without overshooting the desired voltage state.

As indicated in FIG. 7A, the three programming passes or states may be referred to herein as the first programming pass 708, the foggy programming pass 710 and the fine programming pass 712, respectively. Generally speaking, the first programming pass 708 will be a cruder voltage pulse that leaves the stored voltage at either an Erased (Er) 714 level or an intermediate level (LM 716 in FIG. 7A) where the Er voltage level permits subsequent continued programming into one of the first 4 of the 8 desired voltage states (Er, A, B or C) and the LM voltage level pushes the voltage to a threshold that can be increased to one of the latter 4 of the 8 desired voltage states (D, E, F or G).

In a typical first/foggy/fine programming scheme in the memory such as illustrated in FIG. 7A, the original 3 host bits are repeatedly sent from the controller to the NAND to perform each of the three programming stages. Thus, in the second or "foggy" programming step the UP, MP, and LP data are again sent from controller to NAND memory. The UP, MP and LP bits are used by the non-volatile memory (e.g. NAND flash) to generate the foggy programming stage voltage pulses needed to push the current state (Er or LM) achieved in the first programming step 708 to a more resolved 1 of the 8 desired states. The hypothetical voltage distribution options, along with the associated state of the 3 page bits at that voltage level, after foggy programming 710 are shown in FIG. 7A. After the second round of transmitting the original 3 bits of data to NAND memory and carrying out the second, or foggy, programming stage 710, the original three bits are again retrieved from RAM in the controller and sent to the NAND to provide the last, or fine, programming steps 712 necessary to achieve the desired 1 of the 8 states. A distribution for the possible programming voltages achieved after the fine programming stage 712 are shown after in FIG. 7A, where the 8 possible states are shown fully restored.

Although each WL will be written to three times, the order of the writing may be interleaved among the wordlines, such as illustrated in FIG. 7B. More specifically, because the first, foggy and fine programming steps applied to neighboring wordlines may lead to program disturb issues, where charges applied to one WL may affect the charges applied to a neighboring WL, a predetermined WL programming order is typically utilized. Thus, the programming of adjacent wordlines may be interleaved to reduce the chances of a program disturb. The WL programming order may essentially progress in a diagonal pattern from lower left to upper right of the table. For example, the first programming pass to WL0 is followed by a first programming pass to WL1 and then the foggy programming pass back on WL0. After that, the pattern proceeds where the first program pass on WLN (starting at N=2 in this example) is followed by the foggy program pass on WLN−1 and then the fine programming pass on WLN−2 until the first programming pass on the last WL is completed, as illustrated.

Figure 8A:
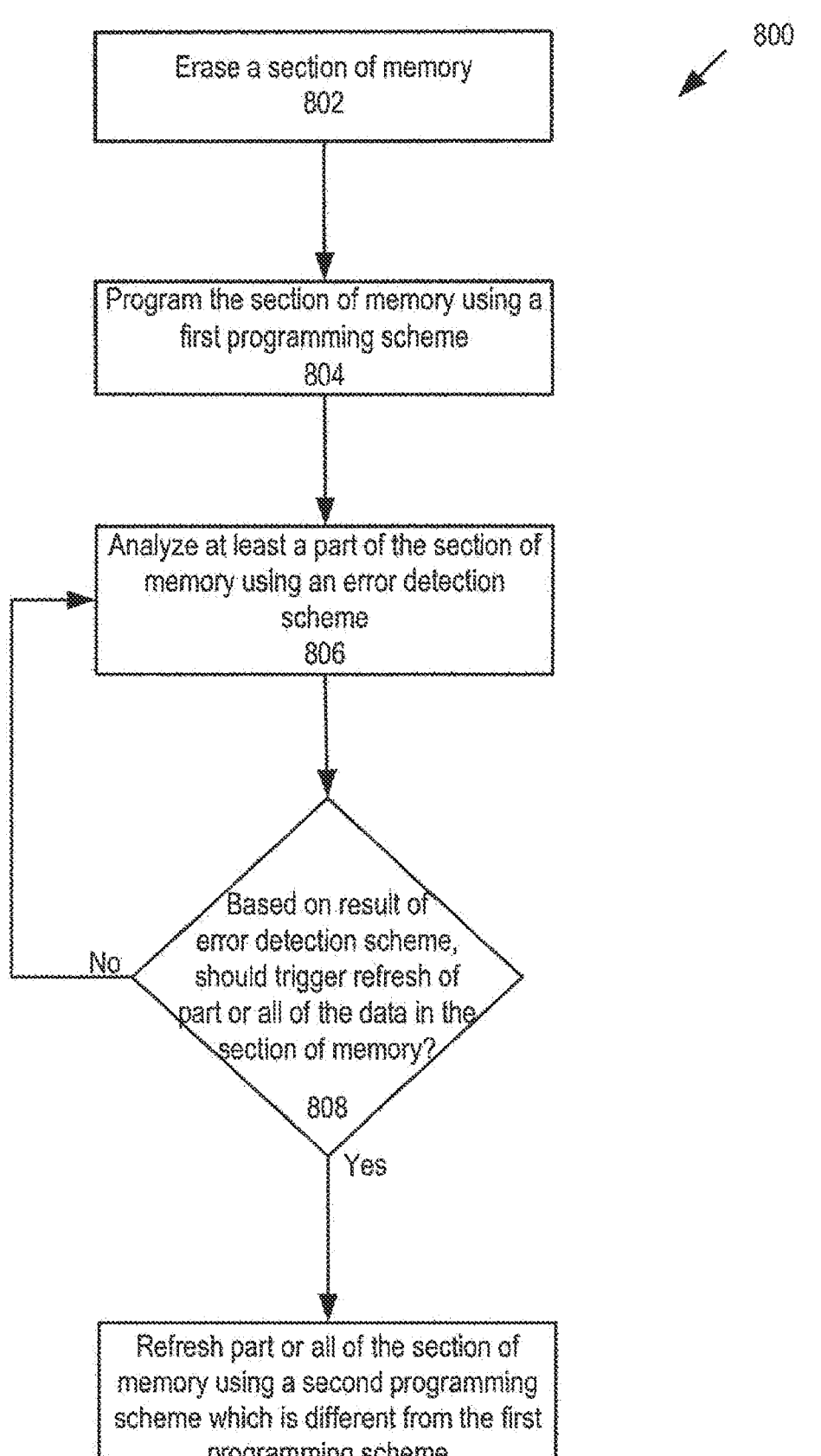
FIG. 8A illustrates a flow chart of a first example of programming data into a section of memory, determining whether to refresh the data, and refreshing part or all of the data according to aspects of the disclosure.

FIG. 8A illustrates a flow chart 800 of a first example of programming data into a section of memory, determining whether to refresh the data, and refreshing part or all of the data. At 802, a section of memory, such as a block, is erased. At 804, the section of memory is programmed using a first programming scheme. An example of the first programming scheme is illustrated in FIG. 7A.

At 806, at least a part of the section of memory is analyzed using an error detection scheme. For example, data from part or all of the block is read and analyzed, using an ECC engine, to determine BER. Reading the data from cells in the block may be an iterative process. The read level conditions for the cells are initially set for the different states of the multi-bit cells. For example, in the 3-bit-per-cell example, the initial read voltages for the different states are as follows: A=1.5875V; B=3.1875V; C=3.4875V; D=4.2875V; E=5.0875V; F=5.8875V; G=6.3875V. The results are sent to the ECC engine to determine whether the BER is correctable. If the ECC engine determines that the BER is too high to correct the errors, the initial read voltages are modified (e.g., reduced by 0.1) and the process is repeated to determine if the generated BER is correctable. Other error detection schemes to determine an error in the data are contemplated.

At 808, based on the result of the error detection scheme, it is determined whether to trigger a refresh of part or all of the data in the section of memory. For example, the result of the error detection scheme may be compared with a threshold. In response to determining that the result of the error detection scheme indicates greater errors in the section of memory than the threshold, refresh may be triggered in the section of memory.

As discussed above, the threshold may be selected dependent on one or more factors, such as: state of the section of memory subject to potential refresh (e.g., has the data recently been folded into an MLC block; the number of program/erase cycles for the block; the number of reads to the block after the block has been programmed); environmental conditions (e.g., temperature of the memory device (e.g., temperature of the memory chip that houses the memory array); Vcc of the memory device (e.g., the power supplied to the memory chip); etc.).

For example, an ECC engine may generate a BER. The BER may be compared to a threshold to determine whether to trigger refresh of part or all of the data in the section of memory. One type of ECC engine is a BCH engine of a 2K byte data trunk (approximately 16K bits). In this example, the ECC engine is unable to correct for errors more than 122 bits, which is considered the Uncorrectable ECC (UECC). The BER may be compared against an RfECC (refresh ECC). The RfECC may be a predetermined static number, such as 100. Alternatively, the RfECC may be a variable number depending on various conditions of the memory device. As one example, a first RfECC may be used when checking an MLC block immediately after folding data from SLC into the MLC block. A second RfECC, different from the first RfECC, may be used thereafter. As another example, the RfECC may change depending on the age of or wear to the block. Various age indicators may be used, such as the program/erase cycles (P/E) or the number of reads that have been applied to the block after programming of the block. In the context of the example given above, the RfECC may change as the block ages, such as an RfECC of 100, 80, and 60, respectively as the block is determined to be "newer", "moderately aged", and "greatly aged". In this regard, the refreshing of the block (or a subpart of the block) may be more aggressive as the block ages. Likewise, the RfECC may change depending on the number of reads to the block, with the RfECC decreasing as the number of reads to the block increases. Again, in this regard, the refreshing of the block (or a subpart of the block) may be more aggressive as more reads are performed on the block.

As still another example, the RfECC may change depending on the overall conditions of the memory device. Overall conditions may include conditions internal to the memory device, such as the Vcc level (which may be determined by system circuitry), or may include ambient conditions to the memory device, such as temperature. In the context of temperature, the RfECC may be higher when the temperature of the memory device is higher than a temperature threshold, and may be lower when the temperature of the memory device is lower than a temperature threshold.

In response to determining to refresh the section of memory, at 810, the refreshing of the section of memory may be performed on part (or all) of the section of memory. The refreshing may be performed using a second programming scheme which is different from the first programming scheme used at 804.

As discussed above, FIG. 7A illustrates one example of a programming scheme that may be used at 804 after erasing a block. Because at 810 a refresh is performed, data is already programmed in the section of memory, albeit with a shifted Vt. In this regard, the step(s) to perform the refresh and/or the voltages used in the steps may be different from the programming scheme used at 804 after erasing the block. For example, FIG. 7A illustrates different steps of first/foggy/fine. In one embodiment, the refresh does not perform the "first" step and the "foggy" step, instead only performing the "fine" step. As another example, the voltages used in the refresh may be different from the programming scheme used at 804 after erasing the block.

For example, in the 3-bit-per-cell NAND flash memory, the refresh procedure may comprise using an initial programming voltage. As discussed in more detail below, the initial programming voltage may be static or dynamic. Cells that are to be programmed to the same state are programmed together. More specifically, a wordline may include, for example, 140 thousand cells. Each of the cells on the wordline for refreshing to the A state may be programmed at the same time. After applying the programming voltage, the program verify circuitry may use a set of predetermined voltages to determine whether the cell has been properly programmed. For exemplary purposes, the verify levels for the 3-bit-per cell NAND flash memory, from A to G, may comprise 0.8, 1.6, 2.4, 3.2, 4.0, 4.8, 5.6V. In the event that the program verify fails, the initial programming voltage may be increased (e.g., by 40 mV), and the process may be repeated. In one embodiment, the number of repeats of the process may be limited to a predetermined number. After which, the memory chip may report a failure to the memory system controller, as discussed in more detail below. This process may be repeated for each of states A through G.

As discussed above, the voltage used in the refresh operation may in one embodiment be static and in an alternate embodiment be dynamic. For example, in response to determining to perform the refresh, predetermined static voltage(s) may be used to refresh the section of memory. As another example, in response to determining to perform the refresh, the voltages used in the refresh may be dynamically selected. More specifically, the voltages may be selected based on one or more factors including: the amount of errors in the section of memory; and/or the overall conditions of the memory device. For example, a lookup table may correlate different BERs to different programming voltages. In this regard, a higher BER may result in a higher programming voltage for the refresh operation.

In addition, in response to determining to trigger the refresh at 808, performing the refresh at 810 may be performed at various times. In one embodiment, the refresh at 810 may be immediately in response to determining to trigger the refresh at 808. In an alternate embodiment, the refresh at 810 need not be performed immediately in response to determining to trigger the refresh at 808. Rather, the section of memory, such as the block, that is subject to refresh may be added to a list of sections of memory for refresh. When the memory device is idle, the memory device may refresh the sections of memory on the list.

Further, as discussed above, different sections of memory may be refreshed. As one example, an entire block may be refreshed. More specifically, a single read within a block may trigger refresh of the entire block. As another example, a sub-part of a block may be refreshed. More specifically, one or more specific wordlines within a block may be refreshed, while the remaining wordlines in the block may be untouched. As discussed above, a block may be made up of multiple wordlines, such as wordlines 0 to 127. A read may be performed on a single wordline, such as wordline 50. The memory device may determine, based on the BER from the read from wordline 50, that wordline 50 should be refreshed. In this regard, the memory device may refresh only wordline 50, without refreshing wordlines 0-49 or 51-127.

FIG. 8B illustrates a flow chart 850 of a second example of programming data into a section of memory, determining whether to refresh the data, and refreshing part or all of the data. At 852, potential data corruption is detected, such as due to data retention or cycling. At 854, the system is scanned for the physical address of the potential corrupted data. The scan of the system may be performed during a host read (e.g., the host system commands the read) or during a background system scan, as discussed in more detail below.

At 856, the address of the blocks that contain potentially corrupted data due to data retention or cycling are stored. At 858, the data is read to the ECC engine, and the data is corrected. At 860, the corrected data is sent back to the NAND flash chip, and is used by the NAND flash chip as the original data to verify the original data in the original location. As discussed above, the NAND flash chip may receive the corrected data for refresh. More specifically, the NAND flash chip may, according to the corrected data received, determine which cells in a wordline are to be programmed to which state (e.g., in a 3-bit-per-cell, one of states A-G), refresh the determined cells to the state, and use program verify to determine whether the refresh has resulted in the cells having values corresponding to the state. At 862, this verification process may be applied to the entire block, or to only a part of the block, such as the upper page, the middle page, the lower page, or a combination of pages of the affected wordlines. At 864, the program pulse may be applied to re-program the data back to the location until the verify process passes the verify criteria.

Figure 9:
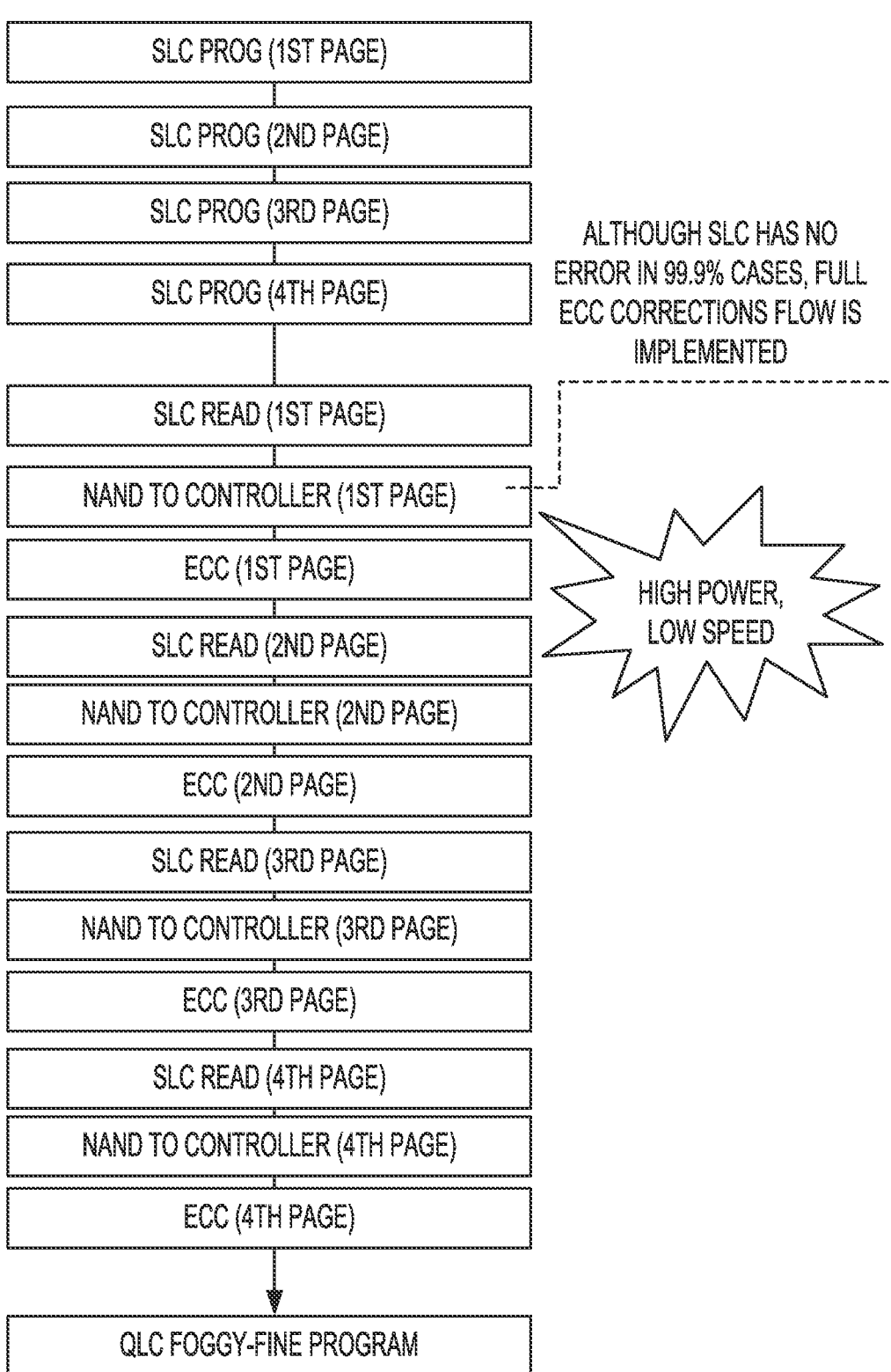
FIG. 9 is a flow chart showing steps of single level cell (SLC) read usage in quad level cell (QLC) foggy-fine programming according to aspects of the disclosure.
Figure 10:
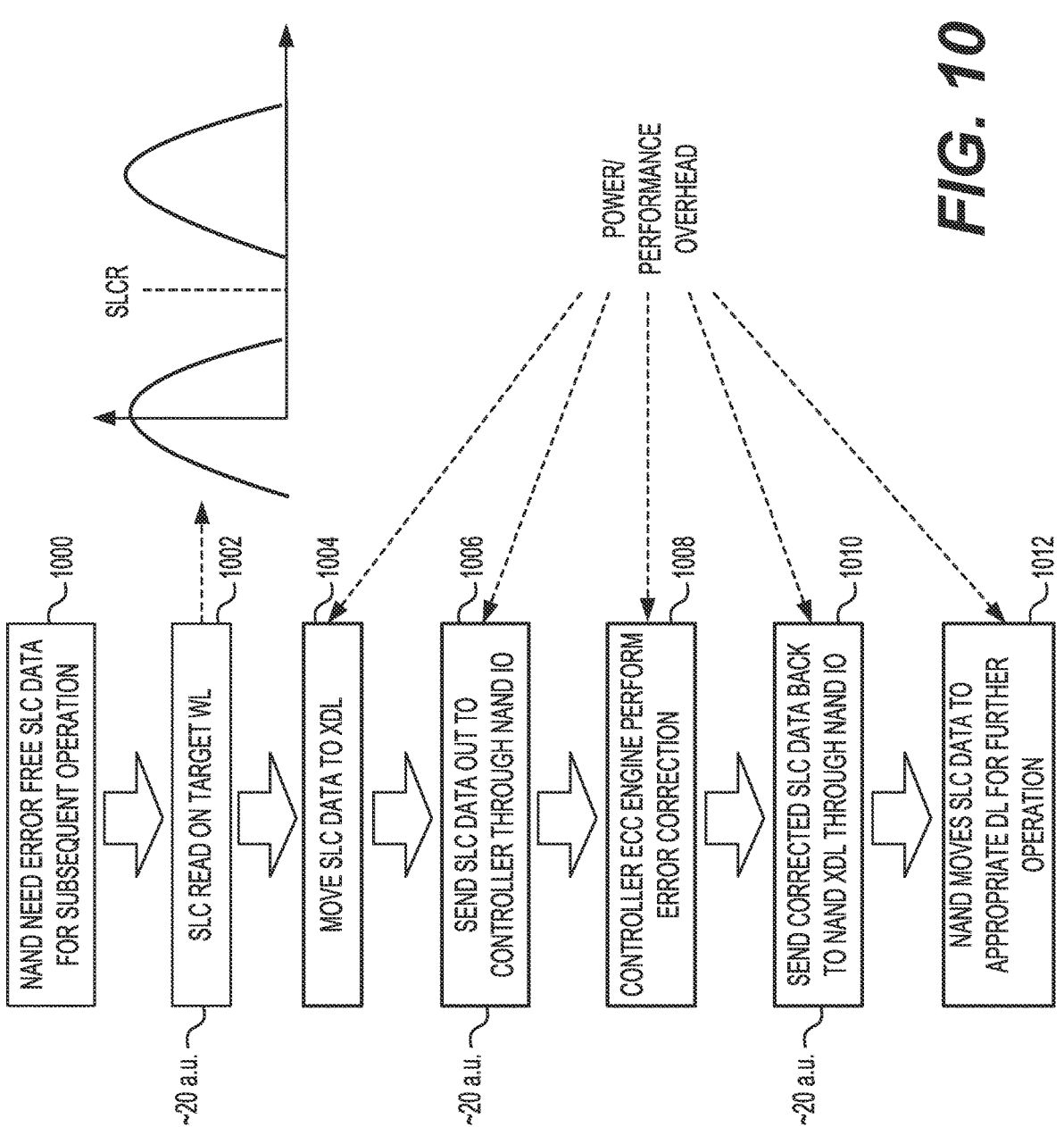
FIG. 10 shows steps of a conventional method of SLC read error detection according to aspects of the disclosure.

Single level cell (SLC) memory is an important feature for many products. For example, as mentioned, some client storage solutions (CSS) use SLC folding technique, user data is written to SLC format first, then SLC data is migrated to quad or four level cell (QLC) blocks through foggy-fine algorithm, for example. FIG. 9 is a flow chart showing steps of single level cell (SLC) read usage in quad level cell (QLC) foggy-fine programming. FIG. 10 shows steps of a conventional method of SLC read error detection. As discussed above and as shown in FIGS. 9 and 10, during this migration, SLC data typically needs to be readout first, then moved to controller through NAND IO, then the ECC engine will decode the data and correct errors, then send back to NAND for foggy-fine program. This process takes time and consumes significant power. In most of case, SLC data is very robust and contains no error. Therefore, sending such SLC data out for ECC and then moving back are not really needed.

Figure 11:
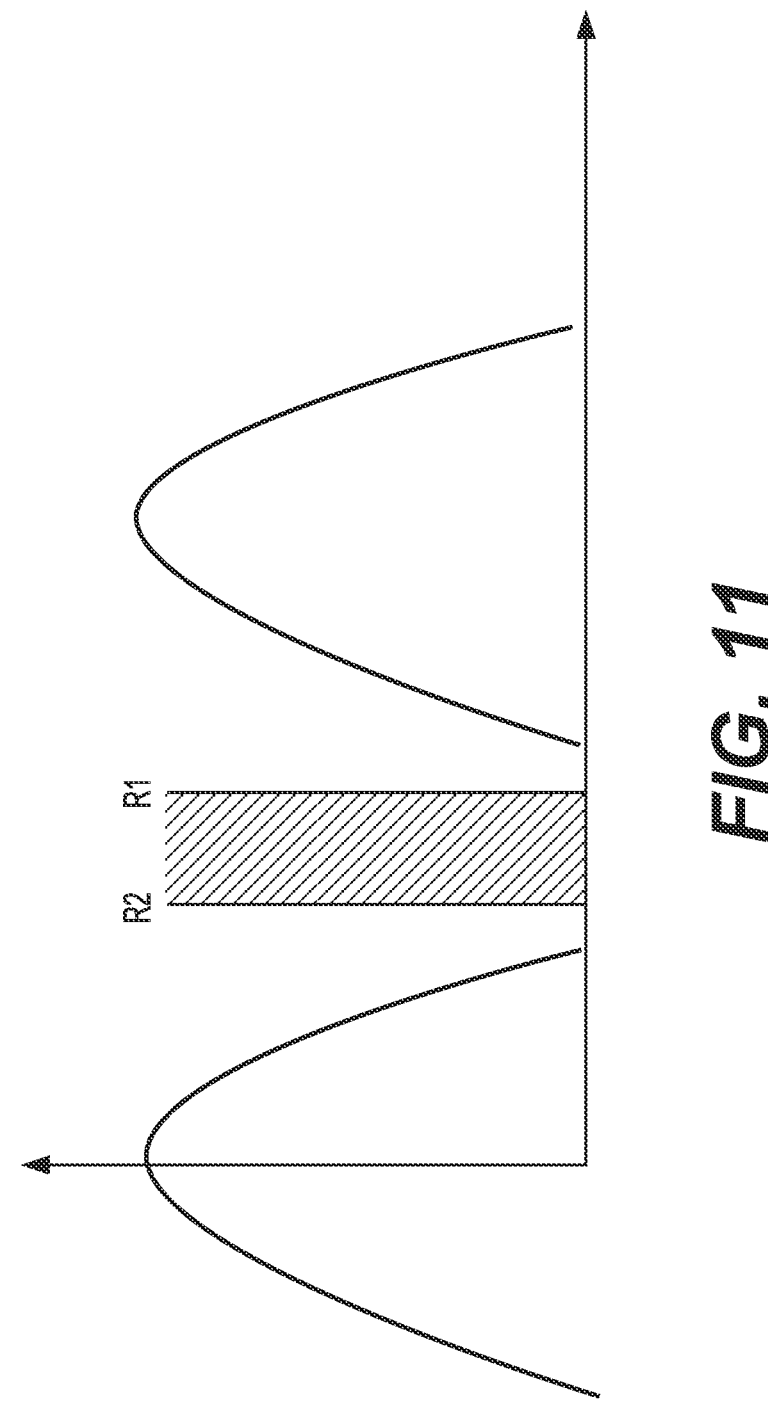
FIG. 11 shows example threshold voltage distributions including an erase state and a programmed state for single level cells according to aspects of the disclosure.

Consequently, described herein is a memory apparatus (e.g., memory device 102 in FIG. 1A) including memory cells (e.g., charge storage memory cells 426-432 in FIG. 4) configured to retain a threshold voltage Vth corresponding to one of a plurality of data states (e.g., states Er, A, B, C, D, E, F, G in FIG. 7A or the two threshold voltage distributions in FIG. 11). The memory apparatus also includes a control means (e.g., system controller 118 in FIGS. 1A-1C, memory device controller chip 200 in FIG. 2A, memory device controller chip 220 in FIG. 2B, memory device controller 300 in FIG. 3A, circuits 314, 316, 324, 326, 328, 330, 332, 334, 336, 342, state machine 344 in FIG. 3B or any combination) configured to detect whether data stored in a group of the memory cells as one bit per each of the memory cells has errors. The control means is also configured to bypass error correction of the data stored in the group of the memory cells in response to not detecting the errors in the data stored.

According to an aspect and referring to FIG. 11, for example, the plurality of data states includes, in order of the threshold voltage increasing in magnitude, an erase state (i.e., the leftmost threshold voltage distribution of FIG. 11) and a programmed state (i.e., the rightmost threshold voltage distribution of FIG. 11). The control means is further configured to bypass the error correction of and directly use the data stored in the group of the memory cells in response to a total quantity of the memory cells having the threshold voltage between the threshold voltage associated with the erase state and the threshold voltage associated with the programmed state not being greater than or equal to a predetermined total quantity threshold. According to another aspect, the predetermined total quantity threshold is zero. Nevertheless, it should be appreciated that the predetermined total quantity threshold may instead be some non-zero value.

As discussed above, the memory cells are each connected to one of a plurality of word lines (e.g., word lines 438-444 in FIG. 4). Thus, according to an aspect, the group of the memory cells comprises the memory cells connected to one of the plurality of word lines. So, the control means is further configured to perform a first read on the memory cells connected to the one of the plurality of word lines using a first read level voltage R1 and count a first quantity of the memory cells having the threshold voltage above the first read level voltage R1. The control means is also configured to perform a second read on the memory cells connected to the one of the plurality of word lines using a second read level voltage R2 and count a second quantity of the memory cells having the threshold voltage above the second read level voltage R2. According to an aspect, the second read level voltage R2 is less than the first read level voltage R1. In addition, the first read level voltage R1 and the second read level voltage R2 are selected to be less than the threshold voltage of the memory cells in the programmed state and greater than the threshold voltage of the memory cells in the erase state. The control means determines the total quantity of the memory cells having the threshold voltage between the first read level voltage R1 and the second read level voltage R2. The total quantity of the memory cells is equal to a difference between the first quantity and the second quantity. The control means is also configured to bypass the error correction of and directly use the data stored in the memory cells connected to the one of the plurality of word lines in response to the total quantity of the memory cells having the threshold voltage between the first read level voltage R1 and the second read level voltage R2 not being greater than or equal to the predetermined total quantity threshold.

Thus, the control means performs an SLC read at two levels (R1 and R2), counts the bits within the two levels (i.e., the first quantity and the second quantity). If the total quantity is less than the predetermined total quantity threshold, the SLC data will not be sent out for ECC correction. Instead, the SLC data can be directly used for subsequent operation (e.g., Foggy-fine programming, folding). If the total quantity is greater than or equal to the predetermined total quantity threshold, SLC data will be sent out for ECC correction and follow conventional method of FIG. 10. Since SLC data is error free for most of cases, skipping controller ECC correction can leads to significant power/performance improvement without sacrificing any accuracy.

In more detail and according to further aspects of the disclosure, the memory apparatus includes a plurality of data latches and a data transfer latch (e.g., NAND data latches in FIG. 1C) coupled between the memory cells and the control means. The memory apparatus further includes an error correction code engine (e.g., ECC circuits in FIG. 1C, ECC module 234 in FIG. 2B) configured to detect and correct the errors of the data stored in the memory cells. So, according to other aspects and referring back to FIG. 10, in response to the total quantity of the memory cells having the threshold voltage between the first read level voltage R1 and the second read level voltage R2 being greater than or equal to the predetermined total quantity threshold, the control means is further configured to perform a normal read on the memory cells connected to the one of the plurality of word lines using a normal read level voltage SLCR to determine the data stored as one bit per each of the memory cells. The memory cells having the threshold voltage above the normal read level voltage SLCR are in the programmed state and the memory cells having the threshold voltage below the normal read level voltage SLCR are in the erase state. In addition, the control means is configured to move the data stored as one bit per each of the memory cells to the data transfer latch. The control means is further configured to send the data stored as one bit per each of the memory cells from the data transfer latch to the control means. In addition, the control means is configured to perform the error correction of the data stored as one bit per each of the memory cells and output corrected single-level cell data using the error correction code engine. The control means is additionally configured to send the corrected single-level cell data back to the data transfer latch. The control means is also configured to move the corrected single-level cell data to one of the plurality of data latches appropriate for further memory operations.

According to another aspect, the first read and the second read are part of a single continuous read sequence or operation. In more detail, the control means is further configured to apply the first read level voltage R1 to the one of the plurality of word lines while applying a read pass voltage to others of the plurality of word lines. The control means is also configured to apply the second read level voltage R2 to the one of the plurality of word lines immediately after applying the first read level voltage R1 to the one of the plurality of word lines. FIG. 12 shows a plot of the voltages applied to a selected one of the bit lines, a drain-side select gate transistor, an unselected word line (CG unselected), a selected word line (CG selected), and a source-side select gate transistor during an example read operation in which the first read and the second read are within one read operation or sequence.

As discussed above, the memory apparatus can further include the error correction code engine configured to detect and correct the errors of the data stored in the memory cells. In addition, the data includes a first page data and a second page data and a third page data and a fourth page data. So, the control means is further configured to program the first page data to the memory cells as one bit per each of the memory cells. In addition, the control means is configured to program the second page data to the memory cells as one bit per each of the memory cells. The control means is additionally configured to program the third page data to the memory cells as one bit per each of the memory cells. In addition, the control means is configured to program the fourth page data to the memory cells as one bit per each of the memory cells.

The control means is further configured to read the first page data stored as one bit per each of the memory cells using a normal read level voltage SLCR. The control means is also configured to check whether the first page data stored in the memory cells as one bit per each of the memory cells has errors and bypass the error correction of the first page data in response to not detecting the errors in the first page data. Furthermore, the control means is configured to perform the error correction of the first page data stored as one bit per each of the memory cells using the error correction code engine in response to detecting the errors in the first page data.

The control means is additionally configured to read the second page data stored as one bit per each of the memory cells using the normal read level voltage SLCR. The control means is also configured to check whether the second page data stored in the memory cells as one bit per each of the memory cells has errors and bypass the error correction of the second page data in response to not detecting the errors in the second page data. In addition, the control means is configured to perform the error correction of the second page data stored as one bit per each of the memory cells using the error correction code engine in response to detecting the errors in the second page data.

The control means reads the third page data stored as one bit per each of the memory cells using the normal read level voltage SLCR. The control means is further configured to check whether the third page data stored in the memory cells as one bit per each of the memory cells has errors and bypass the error correction of the third page data in response to not detecting the errors in the third page data. The control means performs the error correction of the third page data stored as one bit per each of the memory cells using the error correction code engine in response to detecting the errors in the third page data.

In addition, the control means is configured to read the fourth page data stored as one bit per each of the memory cells using the normal read level voltage SLCR. The control means is additionally configured to check whether the fourth page data stored in the memory cells as one bit per each of the memory cells has errors and bypass the error correction of the fourth page data in response to not detecting the errors in the first page data. The control means is further configured to perform the error correction of the fourth page data stored as one bit per each of the memory cells using the error correction code engine in response to detecting the errors in the fourth page data. The control means is also configured to program the first page data and the second page data and the third page data and fourth page data to other ones of the memory cells as four bits per each of the memory cells, the four bits comprising one bit of each the first page data and the second page data and the third page data and the fourth page data. While such folding from SLC data is discussed for QLC data, it should be understood that the folding could instead be to memory cells other than four bit per cell memory cells.

Now referring back to FIG. 10 and to FIGS. 13-15, a method of operating a memory apparatus is also provided. As discussed above, the memory apparatus (e.g., memory device 102 in FIG. 1A) including memory cells (e.g., charge storage memory cells 426-432 in FIG. 4) configured to retain a threshold voltage Vth corresponding to one of a plurality of data states (e.g., states Er, A, B, C, D, E, F, G in FIG. 7A or the two threshold voltage distributions in FIG. 11). Referring to FIG. 13 specifically, the method includes the step of 1300 detecting whether data stored in a group of the memory cells as one bit per each of the memory cells has errors. The method also includes the step of 1302 bypassing error correction of the data stored in the group of the memory cells in response to not detecting the errors in the data stored.

Again, according to an aspect and referring back to FIG. 11, for example, the plurality of data states includes, in order of the threshold voltage increasing in magnitude, the erase state (i.e., the leftmost threshold voltage distribution of FIG. 11) and the programmed state (i.e., the rightmost threshold voltage distribution of FIG. 11). So, the method further includes the step of bypassing the error correction of and directly using the data stored in the group of the memory cells in response to a total quantity of the memory cells having the threshold voltage between the threshold voltage associated with the erase state and the threshold voltage associated with the programmed state not being greater than or equal to a predetermined total quantity threshold. As above and according to an aspect, the predetermined total quantity threshold is zero.

Once again, as discussed above, the memory cells are each connected to one of the plurality of word lines (e.g., word lines 438-444 in FIG. 4). Therefore, according to an aspect, the group of the memory cells comprises the memory cells connected to one of the plurality of word lines. Accordingly, referring now to FIG. 14, the method further includes the step of 1400 determining a need for error free single level data for a memory operation. The method proceeds by 1402 performing a first read on the memory cells connected to the one of the plurality of word lines using a first read level voltage R1 and counting a first quantity of the memory cells having the threshold voltage above the first read level voltage R1. The method continues with the step of 1404 performing a second read on the memory cells connected to the one of the plurality of word lines using a second read level voltage R2 and counting a second quantity of the memory cells having the threshold voltage above the second read level voltage R2, the second read level voltage R2 being less than the first read level voltage R1 and the first read level voltage R1 and the second read level voltage R2 being selected to be less than the threshold voltage of the memory cells in the programmed state and greater than the threshold voltage of the memory cells in the erase state. In addition, the method includes the step of 1406 determining the total quantity of the memory cells having the threshold voltage between the first read level voltage R1 and the second read level voltage R2, the total quantity of the memory cells equal to a difference between the first quantity and the second quantity. The method continues by 1408 determining whether the total quantity of the memory cells having the threshold voltage between the first read level voltage R1 and the second read level voltage R2 is greater than or equal to the predetermined total quantity threshold. Next, 1410 bypassing the error correction of and directly using the data stored in the memory cells connected to the one of the plurality of word lines in response to the total quantity of the memory cells having the threshold voltage between the first read level voltage R1 and the second read level voltage R2 not being greater than or equal to the predetermined total quantity threshold. The method also includes the step of 1412 utilizing a conventional method of SLC read error detection (see e.g., FIG. 10) in response to the total quantity of the memory cells having the threshold voltage between the first read level voltage R1 and the second read level voltage R2 being greater than or equal to the predetermined total quantity threshold.

Again, according to further aspects of the disclosure, the memory apparatus includes the plurality of data latches and the data transfer latch (e.g., NAND data latches in FIG. 1C) coupled to the memory cells. The memory apparatus further includes an error correction code engine (e.g., ECC circuits in FIG. 1C, ECC module 234 in FIG. 2B) configured to detect and correct the errors of the data stored in the memory cells. Thus, according to other aspects and referring back to FIG. 10, in response to the total quantity of the memory cells having the threshold voltage between the first read level voltage R1 and the second read level voltage R2 being greater than or equal to the predetermined total quantity threshold, the method includes the step of 1000 determining a need for error free single level data for a memory operation. The method continues with the step of 1002 performing a normal read on the memory cells connected to the one of the plurality of word lines using a normal read level voltage SLCR to determine the data stored as one bit per each of the memory cells, the memory cells having the threshold voltage above the normal read level voltage SLCR are in the programmed state and the memory cells having the threshold voltage below the normal read level voltage SLCR are in the erase state. The next step of the method is 1004 moving the data stored as one bit per each of the memory cells to the data transfer latch. The method proceeds by 1006 sending the data stored as one bit per each of the memory cells from the data transfer latch to a control means. In addition, the method includes the step of 1008 performing the error correction of the data stored as one bit per each of the memory cells and output corrected single-level cell data using the error correction code engine. The method continues by 1010 sending the corrected single-level cell data back to the data transfer latch. The method also includes the step of 1012 moving the corrected single-level cell data to one of the plurality of data latches appropriate for further memory operations.

According to another aspect, the first read and the second read are part of a single continuous read sequence or operation. So, the method further includes the step of applying the first read level voltage R1 to the one of the plurality of word lines while applying a read pass voltage to others of the plurality of word lines. The method also includes the step of applying the second read level voltage R2 to the one of the plurality of word lines immediately after applying the first read level voltage R1 to the one of the plurality of word lines.

Again, the memory apparatus further includes the error correction code engine configured to detect and correct the errors of the data stored in the memory cells. The data can includes the first page data and the second page data and the third page data and the fourth page data. Now referring to FIG. 15, the method further includes the step of 1500 programing the first page data to the memory cells as one bit per each of the memory cells. The method continues with the step of 1502 programing the second page data to the memory cells as one bit per each of the memory cells. In addition, the method includes the step of 1504 programing the third page data to the memory cells as one bit per each of the memory cells. The method proceeds by 1506 programing the fourth page data to the memory cells as one bit per each of the memory cells.

The next step of the method is 1508 reading the first page data stored as one bit per each of the memory cells using a normal read level voltage SLCR. Next, 1510 checking whether the first page data stored in the memory cells as one bit per each of the memory cells has errors and bypass the error correction of the first page data in response to not detecting the errors in the first page data. The method continues by 1512 performing the error correction of the first page data stored as one bit per each of the memory cells using the error correction code engine in response to detecting the errors in the first page data.

In addition, the method includes the step of 1514 reading the second page data stored as one bit per each of the memory cells using the normal read level voltage SLCR. The method continues with the step of 1516 checking whether the second page data stored in the memory cells as one bit per each of the memory cells has errors and bypassing the error correction of the second page data in response to not detecting the errors in the second page data. The next step of the method is 1518 performing the error correction of the second page data stored as one bit per each of the memory cells using the error correction code engine in response to detecting the errors in the second page data.

The method proceeds by 1520 reading the third page data stored as one bit per each of the memory cells using the normal read level voltage SLCR. Next, 1522 checking whether the third page data stored in the memory cells as one bit per each of the memory cells has errors and bypassing the error correction of the third page data in response to not detecting the errors in the third page data. The method proceeds by 1524 performing the error correction of the third page data stored as one bit per each of the memory cells using the error correction code engine in response to detecting the errors in the third page data.

The method continues with the step of 1526 reading the fourth page data stored as one bit per each of the memory cells using the normal read level voltage SLCR. The next step of the method is 1528 checking whether the fourth page data stored in the memory cells as one bit per each of the memory cells has errors and bypassing the error correction of the fourth page data in response to not detecting the errors in the first page data. In addition, the method includes the step of 1530 perform the error correction of the fourth page data stored as one bit per each of the memory cells using the error correction code engine in response to detecting the errors in the fourth page data. The method also includes the step of 1532 programing the first page data and the second page data and the third page data and fourth page data to other ones of the memory cells as four bits per each of the memory cells, the four bits comprising one bit of each the first page data and the second page data and the third page data and the fourth page data.

So, in the memory apparatus and method of operating the memory apparatus disclosed herein, ECC correction is not always done for SLC data. Such ECC correction is usually slow and power consuming. Thus, as discussed above, the control means or controller of the NAND will check if SLC data is at risk of contamination by checking bit count within certain range and then decide whether ECC is needed. In most cases, ECC is not needed. Therefore, the memory apparatus will keep the data for QLC program or other memory operations. As a result, time and energy are saved.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   memory cells configured to store a threshold voltage corresponding to one of a plurality of data states, the plurality of data states including a first state and a second state; and
   a control means configured to:
       detect whether data stored in a group of the memory cells as one bit per each of the memory cells has errors by comparing a total quantity of the memory cells having threshold voltages between a threshold voltage associated with the first state and a threshold voltage associated with the second state not being greater than or equal to a predetermined total quantity threshold, and
       bypass error correction of the data stored in the group of the memory cells in response to not detecting the errors in the data stored.

2. The memory apparatus as set forth in claim 1, wherein the first state is an erase state and the second state is a programmed state.

3. The memory apparatus as set forth in claim 2, wherein the predetermined total quantity threshold is zero.

4. The memory apparatus as set forth in claim 2, wherein the memory cells are each connected to one of a plurality of word lines, the group of the memory cells comprises the memory cells connected to one of the plurality of word lines, and the control means is further configured to:
   perform a first read on the memory cells connected to the one of the plurality of word lines using a first read level voltage and count a first quantity of the memory cells having the threshold voltage above the first read level voltage;

perform a second read on the memory cells connected to the one of the plurality of word lines using a second read level voltage and count a second quantity of the memory cells having the threshold voltage above the second read level voltage, the second read level voltage being less than the first read level voltage and the first read level voltage and the second read level voltage being selected to be less than the threshold voltage of the memory cells in the programmed state and greater than the threshold voltage of the memory cells in the erase state;

determine the total quantity of the memory cells having the threshold voltage between the first read level voltage and the second read level voltage, the total quantity of the memory cells equal to a difference between the first quantity and the second quantity; and bypass the error correction of and directly use the data stored in the memory cells connected to the one of the plurality of word lines in response to the total quantity of the memory cells having the threshold voltage between the first read level voltage and the second read level voltage not being greater than or equal to the predetermined total quantity threshold.

5. The memory apparatus as set forth in claim 4, further including a plurality of data latches and a data transfer latch coupled between the memory cells and the control means, the memory apparatus further including an error correction code engine configured to detect and correct the errors of the data stored in the memory cells, and in response to the total quantity of the memory cells having the threshold voltage between the first read level voltage and the second read level voltage being greater than or equal to the predetermined total quantity threshold, the control means is further configured to:

perform a normal read on the memory cells connected to the one of the plurality of word lines using a normal read level voltage to determine the data stored as one bit per each of the memory cells, the memory cells having the threshold voltage above the normal read level voltage are in the programmed state and the memory cells having the threshold voltage below the normal read level voltage are in the erase state;

move the data stored as one bit per each of the memory cells to the data transfer latch;

send the data stored as one bit per each of the memory cells from the data transfer latch to the control means;

perform the error correction of the data stored as one bit per each of the memory cells and output corrected single-level cell data using the error correction code engine;

send the corrected single-level cell data back to the data transfer latch; and move the corrected single-level cell data to one of the plurality of data latches appropriate for further memory operations.

6. The memory apparatus as set forth in claim 4, wherein the first read and the second read are part of a single continuous read operation and the control means is further configured to:

apply the first read level voltage to the one of the plurality of word lines while applying a read pass voltage to others of the plurality of word lines; and apply the second read level voltage to the one of the plurality of word lines immediately after applying the first read level voltage to the one of the plurality of word lines.

7. The memory apparatus as set forth in claim 1, wherein the memory apparatus further includes an error correction code engine configured to detect and correct the errors of the data stored in the memory cells, the first state is an erase state and the second state is a programmed state, the data includes a first page data and a second page data and a third page data and a fourth page data, and the control means is further configured to:

program the first page data to the memory cells as one bit per each of the memory cells;

program the second page data to the memory cells as one bit per each of the memory cells;

program the third page data to the memory cells as one bit per each of the memory cells;

program the fourth page data to the memory cells as one bit per each of the memory cells;

read the first page data stored as one bit per each of the memory cells using a normal read level voltage;

check whether the first page data stored in the memory cells as one bit per each of the memory cells has errors and bypass the error correction of the first page data in response to not detecting the errors in the first page data;

perform the error correction of the first page data stored as one bit per each of the memory cells using the error correction code engine in response to detecting the errors in the first page data;

read the second page data stored as one bit per each of the memory cells using the normal read level voltage;

check whether the second page data stored in the memory cells as one bit per each of the memory cells has errors and bypass the error correction of the second page data in response to not detecting the errors in the second page data;

perform the error correction of the second page data stored as one bit per each of the memory cells using the error correction code engine in response to detecting the errors in the second page data;

read the third page data stored as one bit per each of the memory cells using the normal read level voltage;

check whether the third page data stored in the memory cells as one bit per each of the memory cells has errors and bypass the error correction of the third page data in response to not detecting the errors in the third page data;

perform the error correction of the third page data stored as one bit per each of the memory cells using the error correction code engine in response to detecting the errors in the third page data;

read the fourth page data stored as one bit per each of the memory cells using the normal read level voltage;

check whether the fourth page data stored in the memory cells as one bit per each of the memory cells has errors and bypass the error correction of the fourth page data in response to not detecting the errors in the first page data;

perform the error correction of the fourth page data stored as one bit per each of the memory cells using the error correction code engine in response to detecting the errors in the fourth page data; and program the first page data and the second page data and the third page data and fourth page data to other ones of the memory cells as four bits per each of the memory cells, the four bits comprising one bit of each the first page data and the second page data and the third page data and the fourth page data.

8. A controller in communication with a memory apparatus including memory cells configured to store a threshold voltage corresponding to one of a plurality of data states, the plurality of data states including a first state and a second state, and the controller configured to:

instruct the memory apparatus to detect whether data stored in a group of the memory cells as one bit per each of the memory cells has errors by comparing a total quantity of the memory cells having threshold voltages between a threshold voltage associated with the first state and a threshold voltage associated with the second state not being greater than or equal to a predetermined total quantity threshold; and instruct the memory apparatus to bypass error correction of the data stored in the group of the memory cells in response to not detecting the errors in the data stored.

9. The controller as set forth in claim 8, wherein the first state is an erase state and the second state is a programmed state.

10. The controller as set forth in claim 9, wherein the predetermined total quantity threshold is zero.

11. The controller as set forth in claim 9, wherein the memory cells are each connected to one of a plurality of word lines, the group of the memory cells comprises the memory cells connected to one of the plurality of word lines, and the controller is further configured to:

instruct the memory apparatus to perform a first read on the memory cells connected to the one of the plurality of word lines using a first read level voltage and count a first quantity of the memory cells having the threshold voltage above the first read level voltage;

instruct the memory apparatus to perform a second read on the memory cells connected to the one of the plurality of word lines using a second read level voltage and count a second quantity of the memory cells having the threshold voltage above the second read level voltage, the second read level voltage being less than the first read level voltage and the first read level voltage and the second read level voltage being selected to be less than the threshold voltage of the memory cells in the programmed state and greater than the threshold voltage of the memory cells in the erase state;

determine the total quantity of the memory cells having the threshold voltage between the first read level voltage and the second read level voltage, the total quantity of the memory cells equal to a difference between the first quantity and the second quantity; and instruct the memory apparatus to bypass the error correction of and directly use the data stored in the memory cells connected to the one of the plurality of word lines in response to the total quantity of the memory cells having the threshold voltage between the first read level voltage and the second read level voltage not being greater than or equal to the predetermined total quantity threshold.

12. The controller as set forth in claim 11, wherein the memory apparatus further includes a plurality of data latches and a data transfer latch coupled between the memory cells and the controller, the memory apparatus further includes an error correction code engine configured to detect and correct the errors of the data stored in the memory cells, and in response to the total quantity of the memory cells having the threshold voltage between the first read level voltage and the second read level voltage being greater than or equal to the predetermined total quantity threshold, the controller is further configured to:

instruct the memory apparatus to perform a normal read on the memory cells connected to the one of the plurality of word lines using a normal read level voltage to determine the data stored as one bit per each of the memory cells, the memory cells having the threshold voltage above the normal read level voltage are in the programmed state and the memory cells having the threshold voltage below the normal read level voltage are in the erase state;

instruct the memory apparatus to move the data stored as one bit per each of the memory cells to the data transfer latch;

instruct the memory apparatus to send the data stored as one bit per each of the memory cells from the data transfer latch to the controller;

perform the error correction of the data stored as one bit per each of the memory cells and output corrected single-level cell data using the error correction code engine;

instruct the memory apparatus to send the corrected single-level cell data back to the data transfer latch; and instruct the memory apparatus to move the corrected single-level cell data to one of the plurality of data latches appropriate for further memory operations.

13. The controller as set forth in claim 11, wherein the first read and the second read are part of a single continuous read operation and the controller is further configured to:

instruct the memory apparatus to apply the first read level voltage to the one of the plurality of word lines while applying a read pass voltage to others of the plurality of word lines; and instruct the memory apparatus to apply the second read level voltage to the one of the plurality of word lines immediately after applying the first read level voltage to the one of the plurality of word lines.

14. A method of operating a memory apparatus including memory cells configured to store a threshold voltage corresponding to one of a plurality of data states, the plurality of data states including a first state and a second state; the method comprising the steps of:

zdetecting whether data stored in a group of the memory cells as one bit per each of the memory cells has errors by comparing a total quantity of the memory cells having threshold voltages between a threshold voltage associated with the first state and a threshold voltage associated with the second state not being greater than or equal to a predetermined total quantity threshold; and bypassing error correction of the data stored in the group of the memory cells in response to not detecting the errors in the data stored.

15. The method as set forth in claim 14, wherein the first state is an erase state and the second state is a programmed state.

16. The method as set forth in claim 15, wherein the predetermined total quantity threshold is zero.

17. The method as set forth in claim 15, wherein the memory cells are each connected to one of a plurality of word lines, the group of the memory cells comprises the memory cells connected to one of the plurality of word lines, and the method further includes the steps of:

performing a first read on the memory cells connected to the one of the plurality of word lines using a first read level voltage and counting a first quantity of the memory cells having the threshold voltage above the first read level voltage;

performing a second read on the memory cells connected to the one of the plurality of word lines using a second read level voltage and counting a second quantity of the memory cells having the threshold voltage above the second read level voltage, the second read level voltage being less than the first read level voltage and the first read level voltage and the second read level voltage being selected to be less than the threshold voltage of the memory cells in the programmed state and greater than the threshold voltage of the memory cells in the erase state;

determining the total quantity of the memory cells having the threshold voltage between the first read level voltage and the second read level voltage, the total quantity of the memory cells equal to a difference between the first quantity and the second quantity; and bypassing the error correction of and directly using the data stored in the memory cells connected to the one of the plurality of word lines in response to the total quantity of the memory cells having the threshold voltage between the first read level voltage and the second read level voltage not being greater than or equal to the predetermined total quantity threshold.

18. The method as set forth in claim 17, wherein the memory apparatus further includes a plurality of data latches and a data transfer latch coupled to the memory cells, the memory apparatus further includes an error correction code engine configured to detect and correct the errors of the data stored in the memory cells, and in response to the total quantity of the memory cells having the threshold voltage between the first read level voltage and the second read level voltage being greater than or equal to the predetermined total quantity threshold, method further includes the steps of:

performing a normal read on the memory cells connected to the one of the plurality of word lines using a normal read level voltage to determine the data stored as one bit per each of the memory cells;

moving the data stored as one bit per each of the memory cells to the data transfer latch;

sending the data stored as one bit per each of the memory cells from the data transfer latch to a control means;

performing the error correction of the data stored as one bit per each of the memory cells and output corrected single-level cell data using the error correction code engine;

sending the corrected single-level cell data back to the data transfer latch; and moving the corrected single-level cell data to one of the plurality of data latches appropriate for further memory operations.

19. The method as set forth in claim 17, wherein the first read and the second read are part of a single continuous read operation and the method further includes the steps of:

applying the first read level voltage to the one of the plurality of word lines while applying a read pass voltage to others of the plurality of word lines; and applying the second read level voltage to the one of the plurality of word lines immediately after applying the first read level voltage to the one of the plurality of word lines.

20. The method as set forth in claim 14, wherein the memory apparatus further includes an error correction code engine configured to detect and correct the errors of the data stored in the memory cells, the first state is an erase state and the second state is a programmed state, the data includes a first page data and a second page data and a third page data and a fourth page data, and the method further includes the steps of:

programing the first page data to the memory cells as one bit per each of the memory cells;

programing the second page data to the memory cells as one bit per each of the memory cells;

programing the third page data to the memory cells as one bit per each of the memory cells;

programing the fourth page data to the memory cells as one bit per each of the memory cells;

reading the first page data stored as one bit per each of the memory cells using a normal read level voltage;

checking whether the first page data stored in the memory cells as one bit per each of the memory cells has errors and bypass the error correction of the first page data in response to not detecting the errors in the first page data;

performing the error correction of the first page data stored as one bit per each of the memory cells using the error correction code engine in response to detecting the errors in the first page data;

reading the second page data stored as one bit per each of the memory cells using the normal read level voltage;

checking whether the second page data stored in the memory cells as one bit per each of the memory cells has errors and bypassing the error correction of the second page data in response to not detecting the errors in the second page data;

performing the error correction of the second page data stored as one bit per each of the memory cells using the error correction code engine in response to detecting the errors in the second page data;

reading the third page data stored as one bit per each of the memory cells using the normal read level voltage;

checking whether the third page data stored in the memory cells as one bit per each of the memory cells has errors and bypassing the error correction of the third page data in response to not detecting the errors in the third page data;

performing the error correction of the third page data stored as one bit per each of the memory cells using the error correction code engine in response to detecting the errors in the third page data;

reading the fourth page data stored as one bit per each of the memory cells using the normal read level voltage;

checking whether the fourth page data stored in the memory cells as one bit per each of the memory cells has errors and bypassing the error correction of the fourth page data in response to not detecting the errors in the first page data;

perform the error correction of the fourth page data stored as one bit per each of the memory cells using the error correction code engine in response to detecting the errors in the fourth page data; and programing the first page data and the second page data and the third page data and fourth page data to other ones of the memory cells as four bits per each of the memory cells, the four bits comprising one bit of each the first page data and the second page data and the third page data and the fourth page data.

* * * * *